(12) United States Patent
Suzuki et al.

(10) Patent No.: US 9,338,890 B2
(45) Date of Patent: May 10, 2016

(54) SEMICONDUCTOR DEVICE, AND IMAGE FORMING APPARATUS AND IMAGE READING APPARATUS USING THE SAME

(71) Applicant: Oki Data Corporation, Tokyo (JP)

(72) Inventors: Takahito Suzuki, Tokyo (JP); Eisuke Kuroki, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 14/724,286

(22) Filed: May 28, 2015

(65) Prior Publication Data

US 2015/0346021 A1 Dec. 3, 2015

(30) Foreign Application Priority Data

May 29, 2014 (JP) ................................. 2014-111078

(51) Int. Cl.
*H05K 1/18* (2006.01)
(52) U.S. Cl.
CPC ...... *H05K 1/181* (2013.01); *H05K 2201/09827* (2013.01)
(58) Field of Classification Search
CPC ....... G01J 1/0411; G01J 1/4228; H05K 1/181
See application file for complete search history.

(56) References Cited

U.S. PATENT DOCUMENTS 8,587,125 B2 * 11/2013 Sasaki ................ H01L 21/6835
257/686

FOREIGN PATENT DOCUMENTS

JP       2001-274006 A    10/2001
JP       2001274006 A  *  10/2001

* cited by examiner

*Primary Examiner* — Sarah Al Hashimi
(74) *Attorney, Agent, or Firm* — Rabin & Berdo, P.C.

(57) ABSTRACT

A semiconductor device includes: a printed wiring board; plural semiconductor array elements mounted on the printed wiring board in a row with an adhesive, each of the semiconductor array elements including plural semiconductor elements arranged in a row, the semiconductor array elements including a first semiconductor array element and a second semiconductor array element adjacent to the first semiconductor array element, the first semiconductor array element having a first facing surface, the second semiconductor array element having a second facing surface facing the first facing surface; a first contact prevention member that is made of organic material and disposed to project from the first facing surface; and a second contact prevention member that is made of organic material and disposed to project from the second facing surface. The first and second contact prevention members are disposed to abut each other or face each other with a gap therebetween.

16 Claims, 15 Drawing Sheets

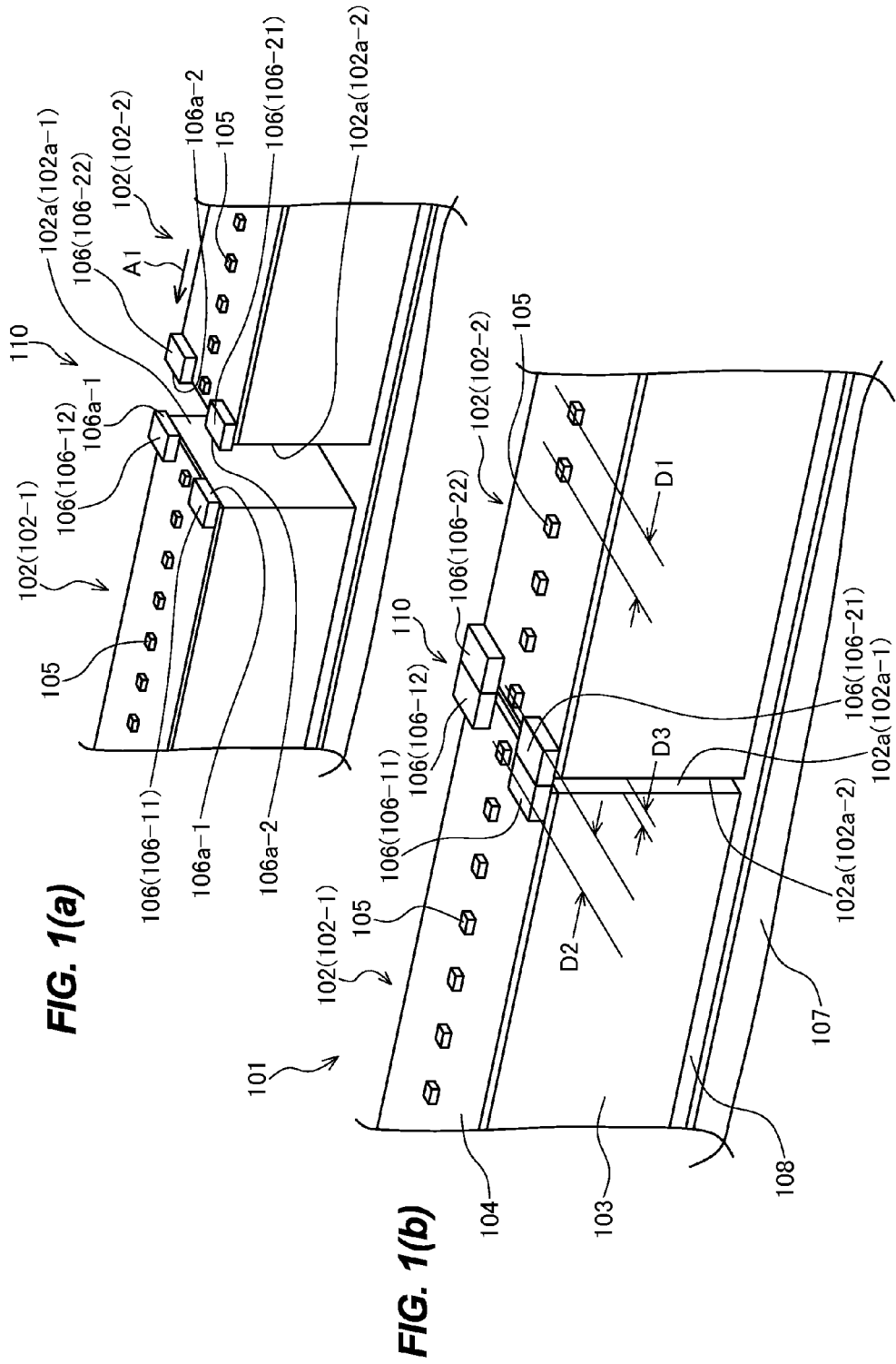

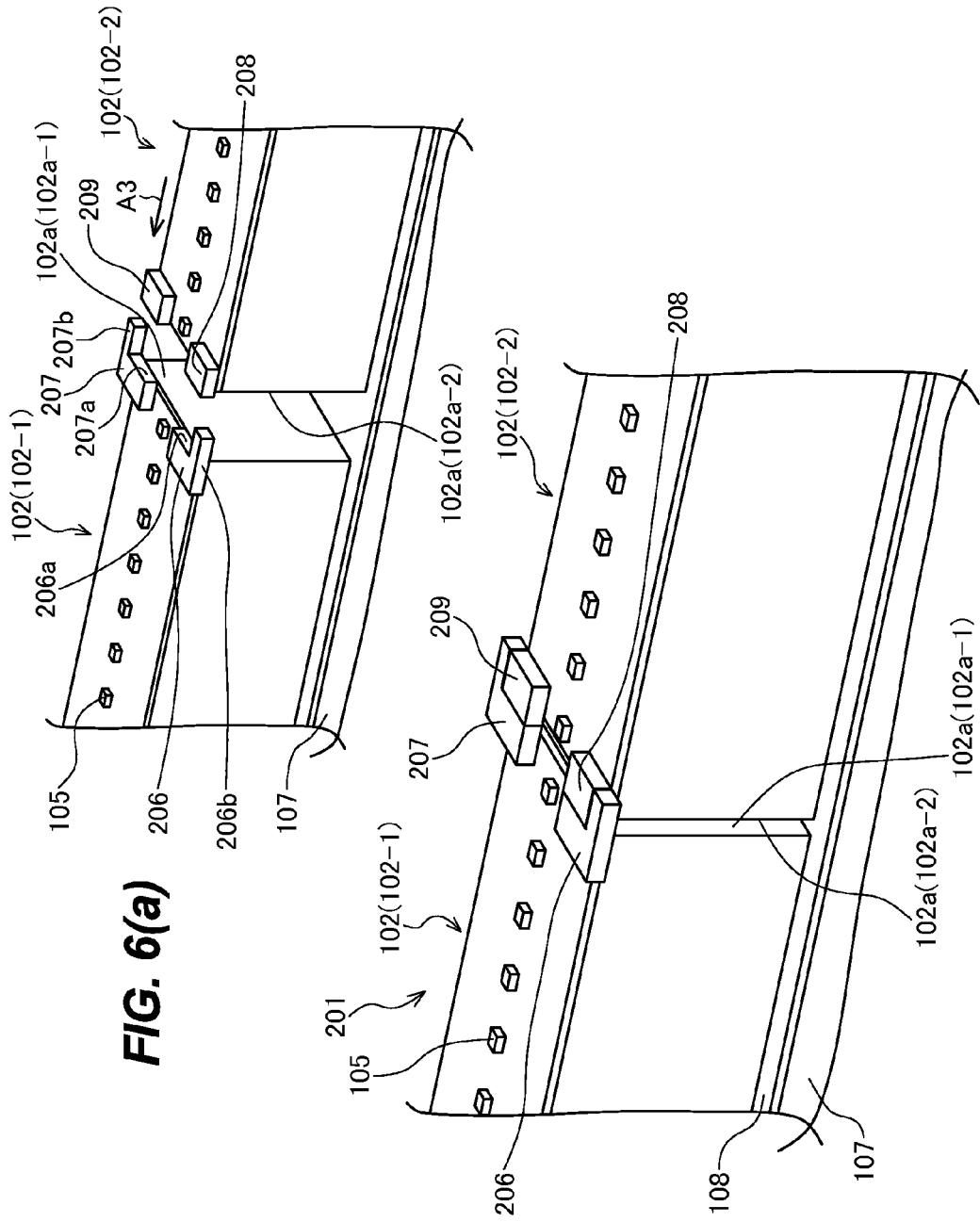

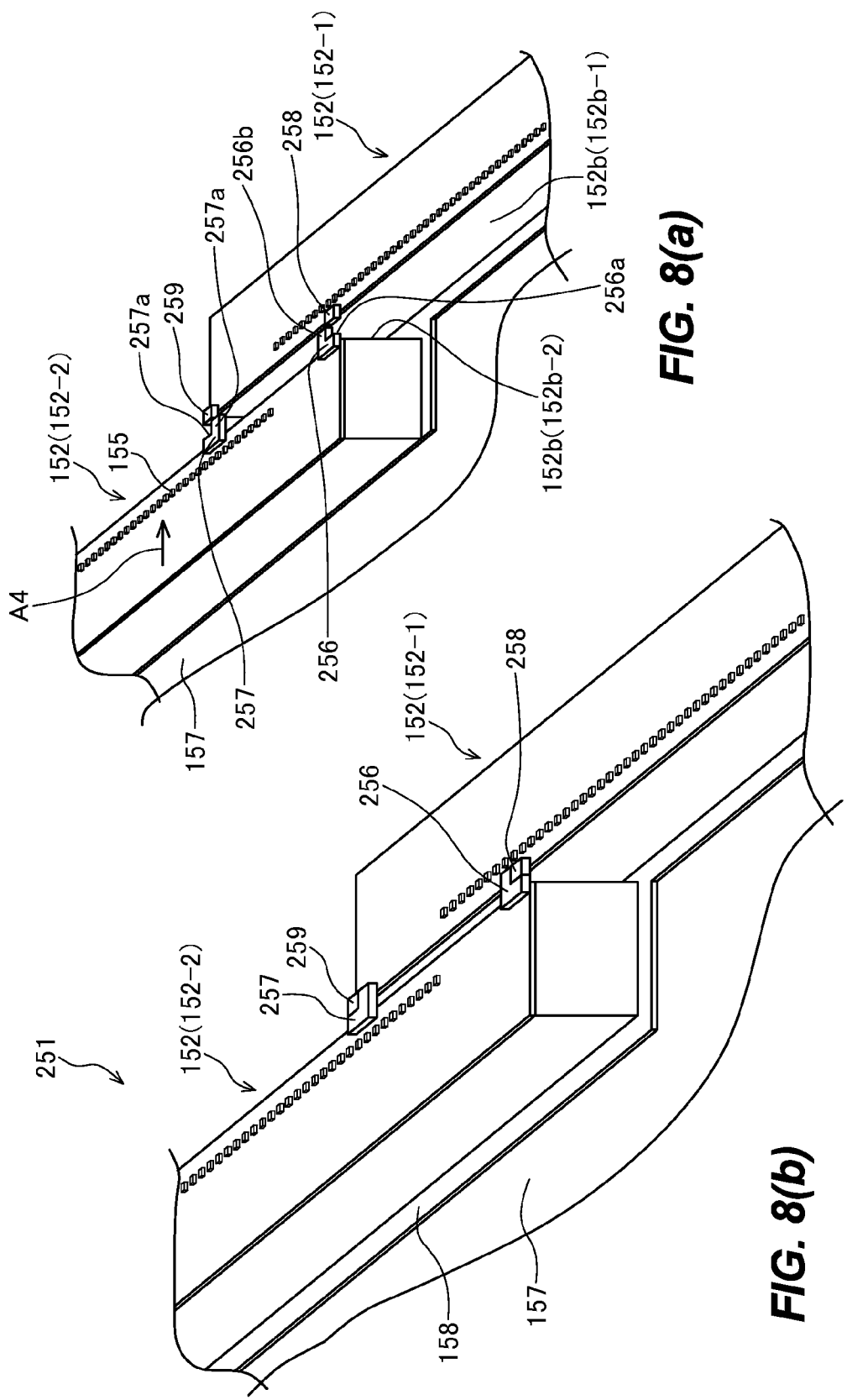

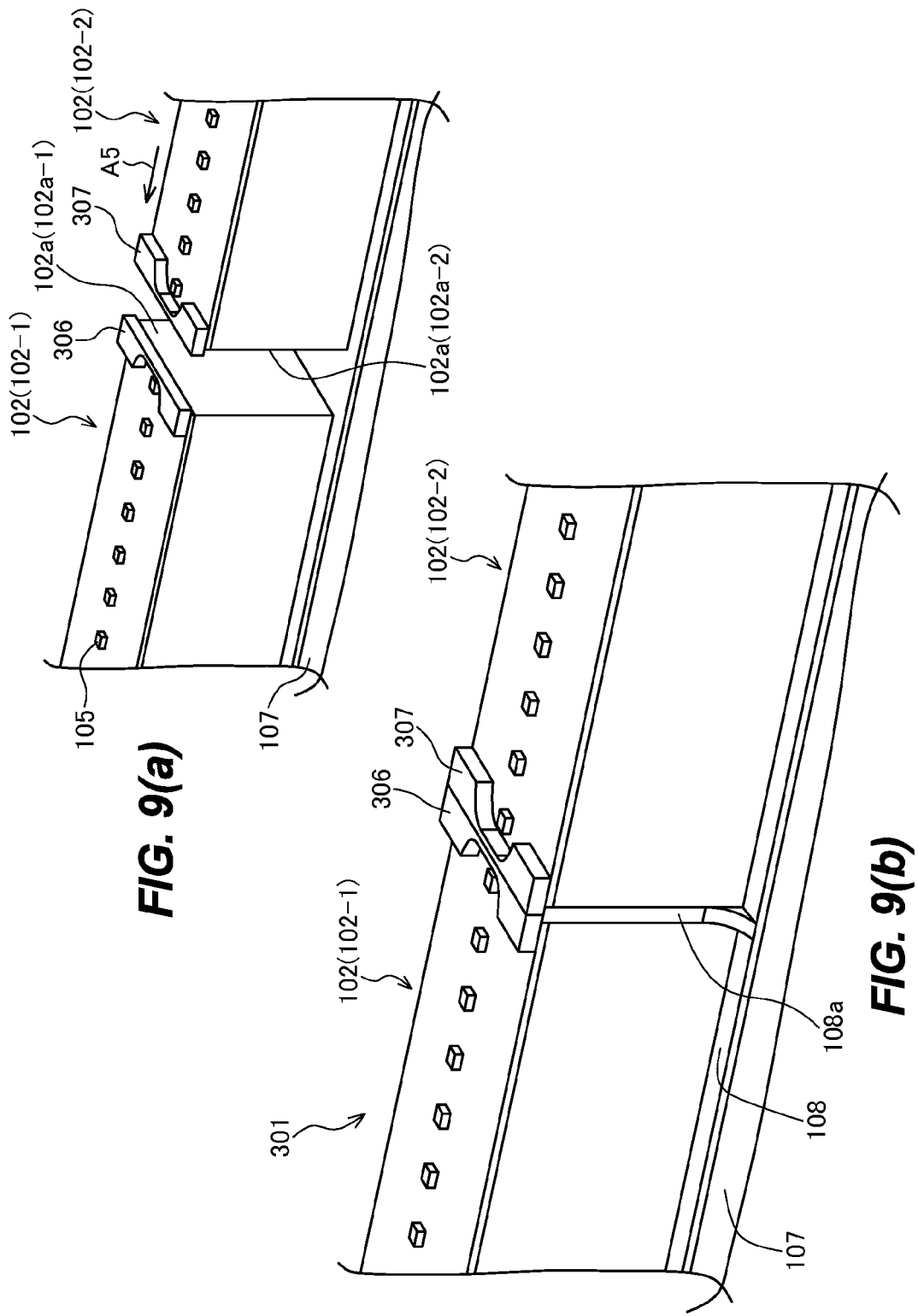

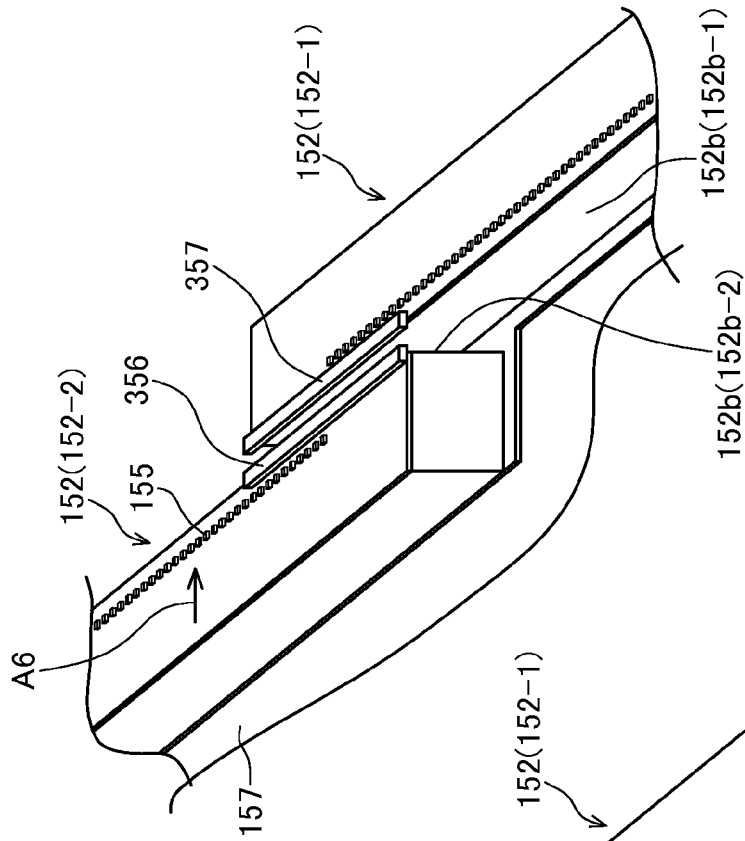
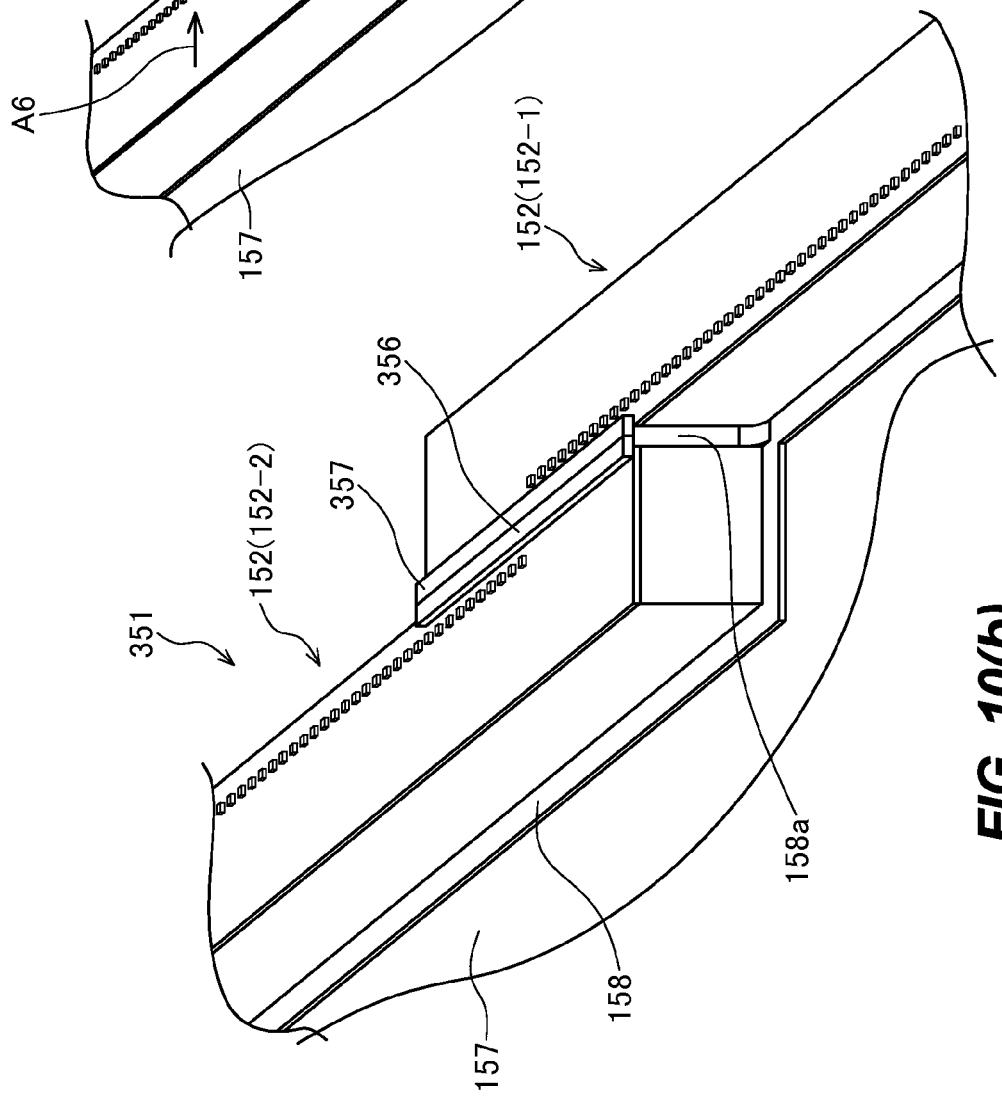
FIG. 10(a)
FIG. 10(b)

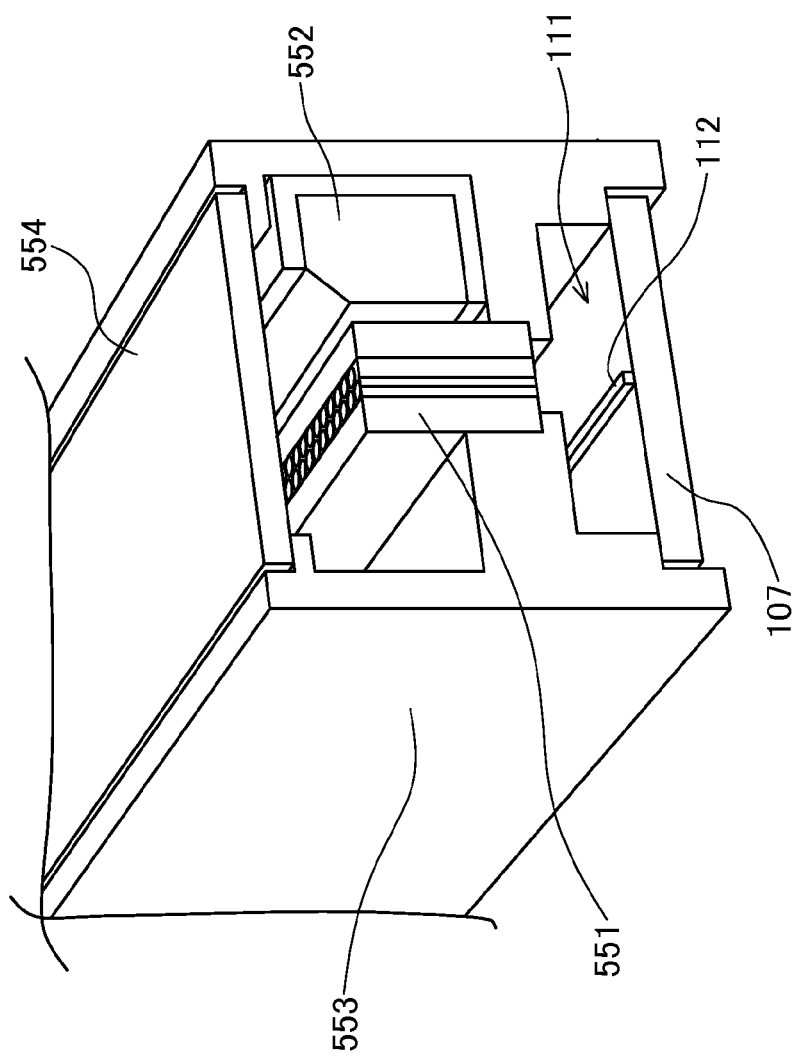
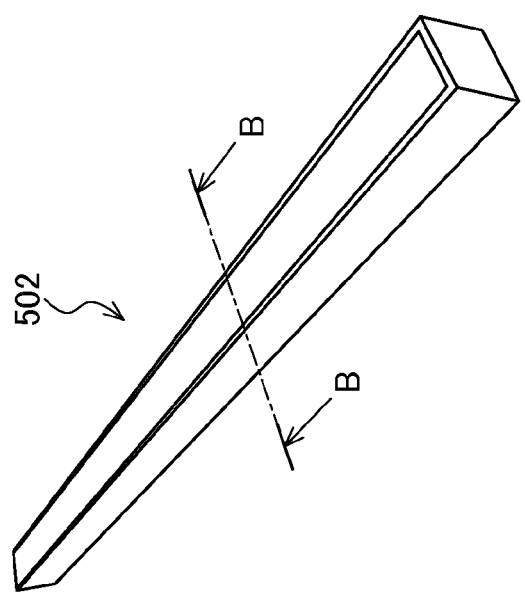

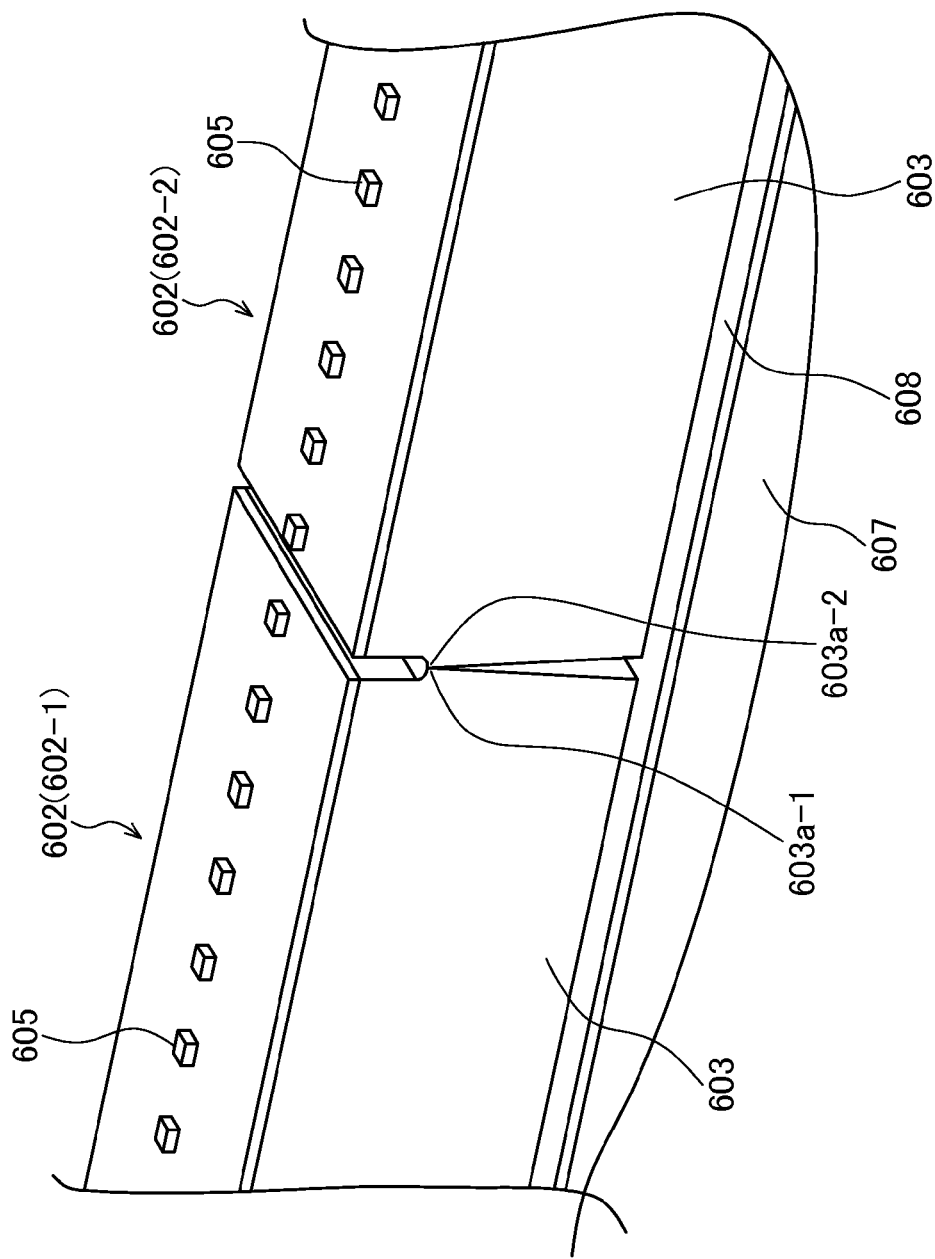

US 9,338,890 B2

SEMICONDUCTOR DEVICE, AND IMAGE FORMING APPARATUS AND IMAGE READING APPARATUS USING THE SAME

BACKGROUND OF THE INVENTION

1. Field of the Invention

The present invention relates to a semiconductor device, and an image forming apparatus and an image reading apparatus using the semiconductor device.

2. Description of the Related Art

Optical print heads and image sensors are known in which plural semiconductor chips each having plural light emitting elements or light receiving elements are die-bonded onto a substrate in an array. Recently, the resolution of images is becoming higher, so the distance between adjacent semiconductor chips is becoming smaller. When adjacent semiconductor chips are arranged close to each other, they may be damaged due to contact therebetween in die bonding.

To solve this problem, Japanese Patent Application Publication No. 2001-274006 discloses a technique in which semiconductor chips are manufactured to have a projection that projects from an end surface of the semiconductor chip relative to a front surface and a back surface of the semiconductor chip, and are adjacently arranged in such a manner that their projections abut each other, so that the front surfaces of the adjacent semiconductor chips are separated from each other and prevented from being damaged.

SUMMARY OF THE INVENTION

An aspect of the present invention is intended to prevent a semiconductor array element from being damaged.

According to an aspect of the present invention, there is provided a semiconductor device including: a printed wiring board; a plurality of semiconductor array elements mounted on the printed wiring board in a row with an adhesive, each of the plurality of semiconductor array elements including a plurality of semiconductor elements arranged in a row, the plurality of semiconductor array elements including a first semiconductor array element and a second semiconductor array element adjacent to the first semiconductor array element, the first semiconductor array element having a first facing surface, the second semiconductor array element having a second facing surface facing the first facing surface; a first contact prevention member that is made of organic material and disposed to project from the first facing surface; and a second contact prevention member that is made of organic material and disposed to project from the second facing surface. The first contact prevention member and the second contact prevention member are disposed to abut each other or face each other with a gap between the first contact prevention member and the second contact prevention member.

According to another aspect of the present invention, there is provided an image forming apparatus including an optical print head including: the above semiconductor device, the plurality of semiconductor elements being light emitting elements; a rod lens array that focuses light emitted by the light emitting elements; and a frame that holds the semiconductor device and the rod lens array in a predetermined positional relationship.

According to another aspect of the present invention, there is provided an image reading apparatus including a contact image sensor head including: the above semiconductor device, the plurality of semiconductor elements being light receiving elements; a rod lens array that focuses light on the light receiving elements; and a frame that holds the semiconductor device and the rod lens array in a predetermined positional relationship.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the attached drawings:

FIGS. 1(a) and 1(b) are external perspective views illustrating a periphery of adjacent ends of adjacent light emitting array elements of a semiconductor device in a first embodiment of the present invention;

FIGS. 6(a) and 6(b) are external perspective views illustrating a periphery of adjacent ends of adjacent light emitting array elements of a semiconductor device in a second embodiment of the present invention;

FIGS. 8(a) and 8(b) are external perspective views illustrating a periphery of adjacent ends of adjacent semiconductor array elements of a semiconductor device according to a third modification of the second embodiment;

FIGS. 9(a) and 9(b) are external perspective views illustrating a periphery of adjacent ends of adjacent light emitting array elements of a semiconductor device in a third embodiment of the present invention;

FIGS. 10(a) and 10(b) are external perspective views illustrating a periphery of adjacent ends of adjacent semiconductor array elements of a semiconductor device according to a modification of the third embodiment;

FIG. 13(a) is an external perspective view of a contact image sensor head in a fifth embodiment of the present invention;

FIG. 13(b) is an enlarged perspective view illustrating a cross section taken along line B-B in FIG. 13(a);

FIG. 15 is an external perspective view illustrating the configuration of a semiconductor device according to a comparative example.

DETAILED DESCRIPTION OF THE INVENTION

Figure 2A:
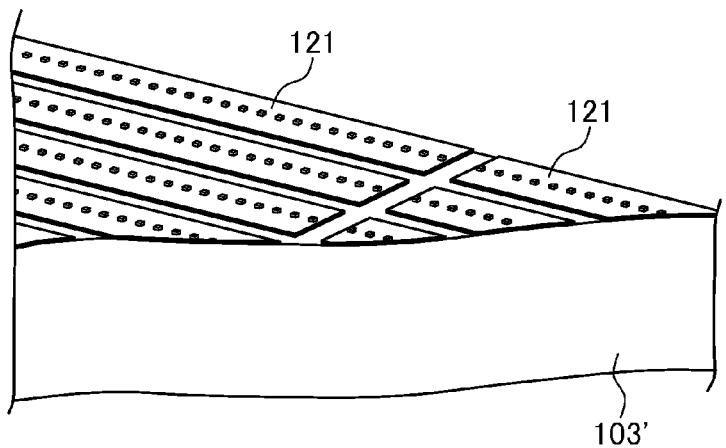
FIGS. 2(a), 2(b), 2(c), 3(a), 3(b), 3(c), 4(a), and 4(b) are drawings for explaining a process of manufacturing light emitting array elements with contact prevention members.

Embodiments of the present invention will now be described with reference to the attached drawings.

First Embodiment

FIGS. 1(a) and 1(b) are partial external perspective views of a semiconductor device 101 in the first embodiment of the present invention.

As illustrated in FIG. 1(b), the semiconductor device 101 includes a printed wiring board (or a substrate) 107, plural light emitting array elements 102 (102-1 and 102-2) as a plurality of semiconductor array elements bonded onto the printed wiring board 107 with an adhesive 108, and a contact prevention structure 110 having a set of contact prevention members 106 (106-11, 106-12, 106-21, and 106-22).

Each of the light emitting array elements 102 includes plural light emitting elements 105 as a plurality of semiconductor elements arranged in a row (or in a straight line) in an arrangement direction (also referred to below as the longitudinal direction or the main scanning direction). The light emitting array elements 102 are arranged in a row (or in a straight line) in the arrangement direction. The light emitting array elements 102 (102-1 and 102-2) are adjacent to each other in the arrangement direction.

Each of the light emitting array elements 102 has an end surface 102a in the arrangement direction facing the other light emitting array element 102. Specifically, the light emitting array element 102-1 has an end surface 102a-1 as a first facing surface. The light emitting array element 102-2 has an end surface 102a-2 as a second facing surface. The end surfaces 102a-1 and 102a-2 face each other.

FIGS. 1(a) and 1(b) illustrate a periphery of the adjacent ends of the adjacent light emitting array elements 102. FIG. 1(a) illustrates a state before the adjacent light emitting array elements 102 are positioned at predetermined positions; FIG. 1(b) illustrates a state after they are positioned at the predetermined positions.

Each of the light emitting array elements 102 includes a substrate 103, a wiring layer 104, and the plural light emitting elements 105. The substrate 103 may be a GaAs substrate, or may be an Si substrate when the light emitting elements 105 are integrated on an integrated circuit (IC) for driving them. The wiring layer 104 is disposed on the substrate 103, and includes a thin film wiring (not illustrated) made of, for example, Al-based or Au-based material, and an interlayer insulating film (not illustrated) mainly made of, for example, SiN or $SiO_2$. The light emitting elements 105 are disposed on the wiring layer 104 in a line at a predetermined pitch (referred to below as the array pitch) D1 and electrically connected to the wiring layer 104.

The contact prevention structure 110 includes a first pair of contact prevention members 106 (106-11 and 106-12) as a first contact prevention member, and a second pair of contact prevention members 106 (106-21 and 106-22) as a second contact prevention member.

The contact prevention members 106 are made of organic material such as epoxy resin, acrylic resin, imide resin, or silicone resin. The contact prevention members 106 have a flat plate shape.

The first pair of contact prevention members 106-11 and 106-12 is disposed on the light emitting array element 102-1. Each of the contact prevention members 106-11 and 106-12 is disposed to project from the end surface 102a-1 (or project toward the end surface 102a-2 relative to the end surface 102a-1). The second pair of contact prevention members 106-21 and 106-22 is disposed on the light emitting array element 102-2. Each of the contact prevention members 106-21 and 106-22 is disposed to project from the end surface 102a-2 (or project toward the end surface 102a-1 relative to the end surface 102a-2). The contact prevention members 106-11 and 106-21 are disposed to abut each other or face each other with a gap (or clearance) therebetween. The contact prevention members 106-12 and 106-22 are disposed to abut each other or face each other with a gap (or clearance) therebetween.

Specifically, the contact prevention members 106-11 and 106-12 are disposed on the wiring layer 104 of the light emitting array element 102-1 at both ends of an upper edge of the end surface 102a-1. Each of the contact prevention members 106-11 and 106-12 has an edge 106a-1 projecting from the end surface 102a-1 by a predetermined amount (or length) in the arrangement direction. The contact prevention members 106-21 and 106-22 are disposed on the wiring layer 104 of the light emitting array element 102-2 at both ends of an upper edge of the end surface 102a-2. Each of the contact prevention members 106-21 and 106-22 has an edge 106a-2 projecting from the end surface 102a-2 by a predetermined amount (or length) in the arrangement direction. The edges 106a-1 and the edges 106a-2 are disposed to abut each other or face each other with a gap therebetween.

Although depending on a resolution or edge design of the light emitting array elements 102, a length of projection of each contact prevention member 106 is, for example, equal to or less than half of a clearance (or gap) D3 formed between the adjacent light emitting array elements 102 when the light emitting array elements 102 are die-bonded to the printed wiring board 107. The contact prevention members 106 have a height (or thickness) of, for example, from 10 μm to 100 μm.

In the above description, the two adjacent light emitting array elements 102-1 and 102-2 are described, but the semiconductor device 101 may include three or more light emitting array elements 102 arranged in a row (or in a straight line). In this case, a contact prevention structure similar to the contact prevention structure 110 may be provided between each adjacent pair of the light emitting array elements 102. In one aspect, each light emitting array element 102 is provided with a pair of contact prevention members 106 at one end in the main scanning direction and another pair of contact prevention members 106 at the other end in the main scanning direction.

A process of manufacturing the light emitting array elements 102 with the contact prevention members 106 thereon in the semiconductor device 101 will now be described with reference to FIGS. 2(a) to 2(c), 3(a) to 3(c), and 4(a) and 4(b).

First, as illustrated in FIG. 2(a), plural light emitting array element thin films 121 are formed on a substrate 103' through a semiconductor wafer process including, for example, photolithography, wet or dry etching, thin film formation, and the like so as to be arranged in a matrix (or in two mutually perpendicular directions) with predetermined intervals therebetween. The light emitting array element thin films 121 correspond to the wiring layers 104 and light emitting elements 105 in FIG. 1(b). The substrate 103' eventually becomes the substrate 103 in FIG. 1(b).

Figure 2B:
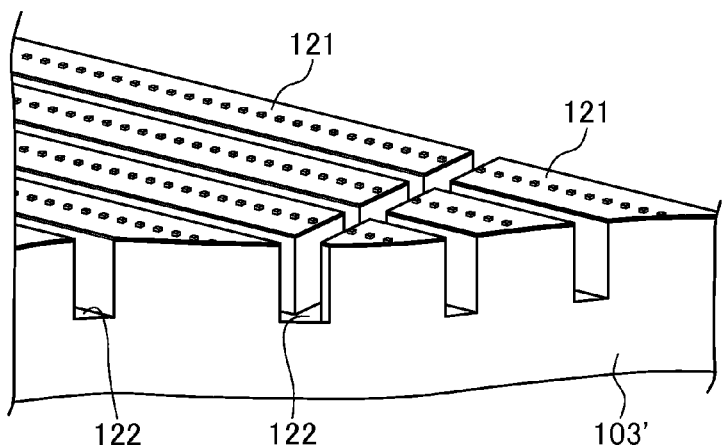

Next, as illustrated in FIG. 2(b), by blade dicing using a dicing saw or chemical dry etching using a reaction gas such as $SF_6$, a portion between the respective light emitting array element thin films 121 in the substrate 103' is cut (or half-cut)

to form a groove 122 in the substrate 103'. The groove 122 has a depth of from 300 µm to 500 µm when the substrate 103' has a thickness of approximately 600 µm, for example.

Figure 2C:
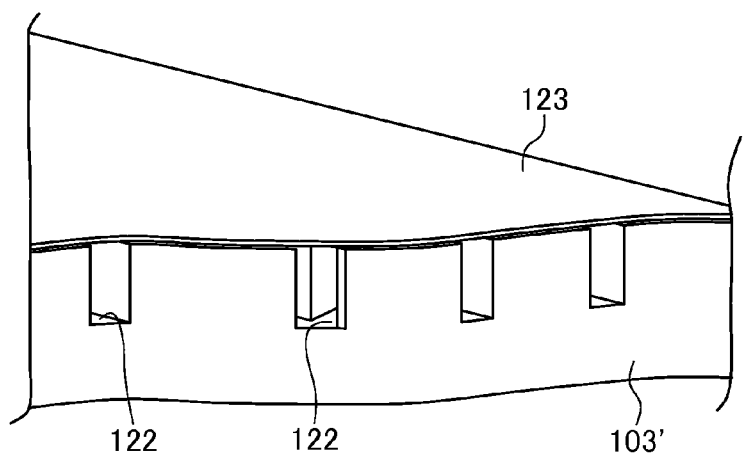

Next, as illustrated in FIG. 2(c), a positive or negative dry film resist 123 made of organic material is laminated on the light emitting array element thin films 121 in such a manner that it tents the groove 122 so as not to fill the groove 122. The dry film resist 123 becomes the contact prevention members 106.

Figure 3A:
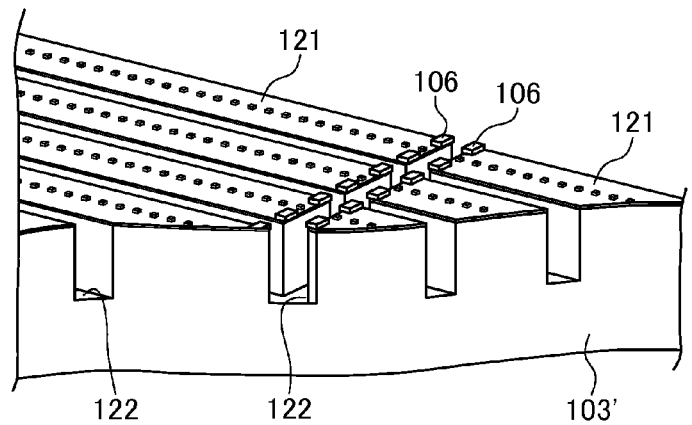

Next, the dry film resist 123 is exposed to light by using a stepper exposure device or a contact exposure device and then developed to form the contact prevention structures consisting of the contact prevention members 106, as illustrated in FIG. 3(a). Further, as necessary, the contact prevention members 106 are baked for curing. The contact prevention members 106 are formed so that for each of the side walls of the groove 122 that become the end surfaces 102a, a pair of contact prevention members 106 projects from both ends of an upper edge of the side wall by the predetermined length, as illustrated in FIG. 3(a).

Figure 3B:
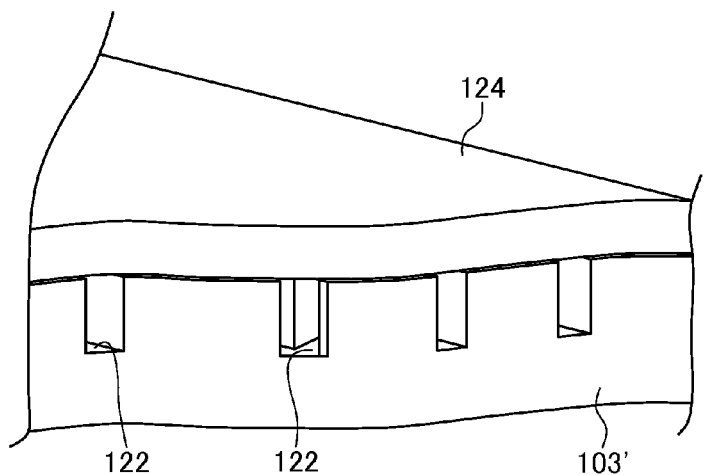
Figure 3C:
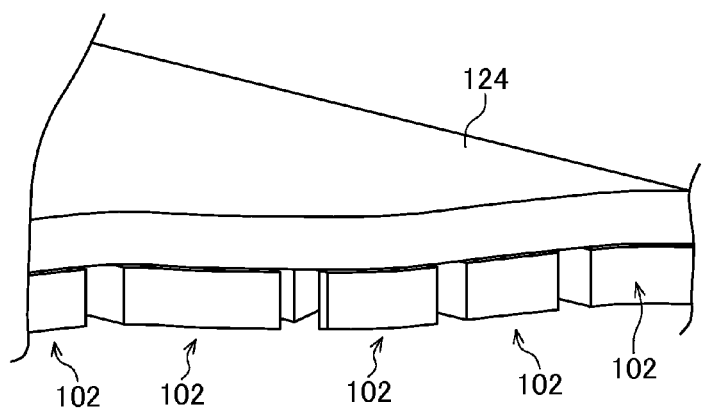

Next, as illustrated in FIG. 3(b), a back grinding tape 124 having an adhesive layer made of ultraviolet (UV) curable adhesive material is laminated on a side on which the light emitting array thin films 121 are formed. Then, a back surface (i.e., a surface opposite the surface on which the light emitting array element thin films 121 are formed) of the substrate 103' is ground so that the substrate 103' having the light emitting array element thin films 121 with the contact prevention members 106 is divided into the plural light emitting array elements 102 (see FIG. 1(b)) having a predetermined height (or thickness), as illustrated in FIG. 3(c).

Figure 4A:
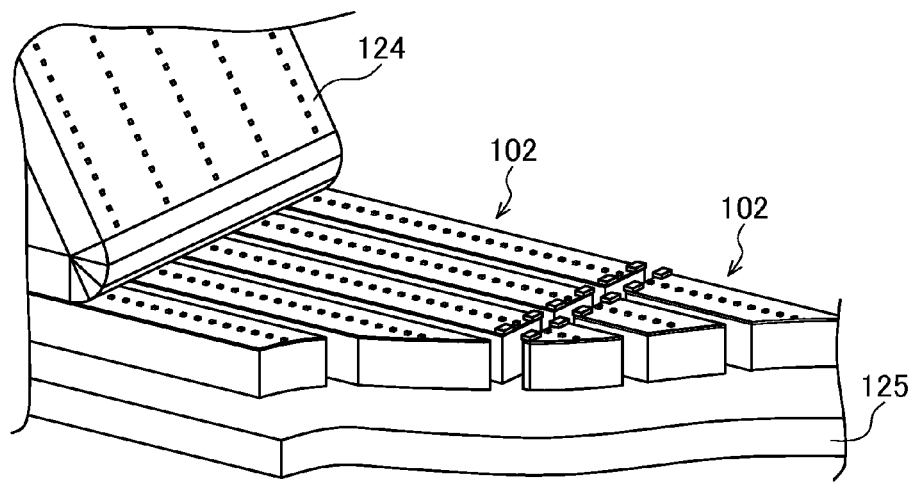
Figure 4B:
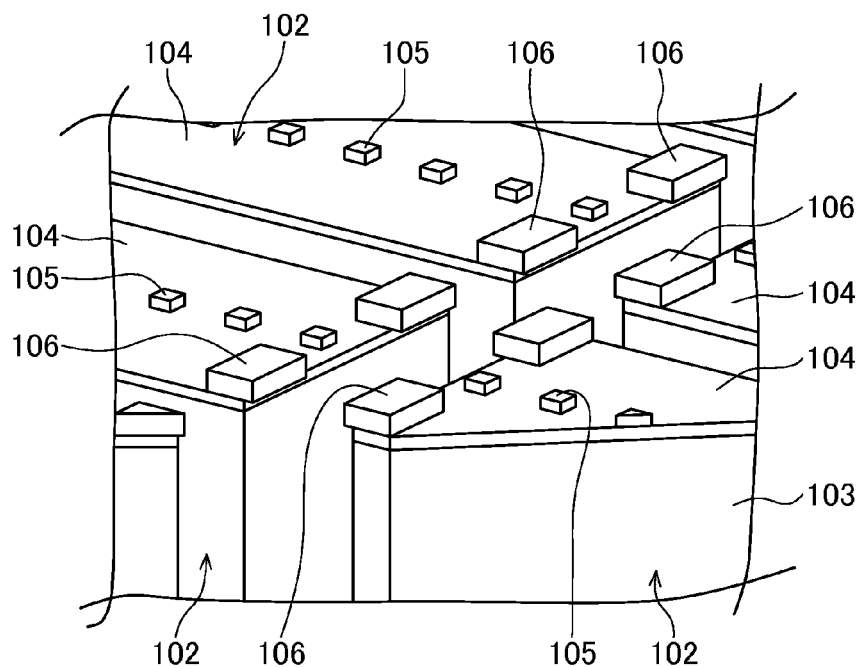

Finally, as illustrated in FIG. 4(a), in a state where a transfer tape 125 is stuck to the light emitting array elements 102 opposite the back grinding tape 124, the back grinding tape 124 is irradiated with UV light so that its adhesion is reduced, and then peeled off. The plural light emitting array elements 102 are adjacently arranged on the transfer tape 125. FIG. 4(b) is an enlarged view of a part of FIG. 4(a) in which some of the plural light emitting array elements 102 are adjacent to each other. As illustrated in FIG. 4(b), the light emitting elements 105 are formed on each light emitting array element 102 and the contact prevention members 106 are disposed at the predetermined positions on the wiring layers 104.

The light emitting array elements 102 with the contact prevention members 106 created as described above are die-bonded onto the printed wiring board 107 using the adhesive 108, which may be conductive or non-conductive, as illustrated in FIG. 1(b). The printed wiring board 107 is made of, for example, glass composite epoxy resin (CEM-3) or glass cloth epoxy resin (FR-4).

As illustrated in FIG. 1(b), the endmost light emitting element 105 adjacent to the light emitting array element 102-2 in the light emitting array element 102-1 and the endmost light emitting element 105 adjacent to the light emitting array element 102-1 in the light emitting array element 102-2 are arranged at a predetermined pitch (referred to below as the adjacent pitch) D2. The adjacent light emitting array elements 102-1 and 102-2 are bonded onto the printed wiring board 107 so that the adjacent pitch D2 is equal to the array pitch D1.

Further, although depending on the edge design, the clearance D3 between the adjacent light emitting array elements 102 is, for example, approximately one fourth of the array pitch D1. For example, when the array pitch D1 is 42.3 µm (i.e., when the resolution is 600 dpi), the clearance D3 is approximately 10 µm; when the array pitch D1 is 21.2 µm (i.e., when the resolution is 1200 dpi), the clearance D3 is approximately 5 µm.

The light emitting array elements 102 are sequentially die-bonded onto the above-described positions. At this time, it is desirable that after the light emitting array element 102-1 is die-bonded, the next light emitting array element 102-2 is die-bonded as follows. The next light emitting array element 102-2 is placed at a position where the contact prevention members 106 of the next light emitting array element 102-2 face and are spaced by a distance of, for example, approximately 100 µm from the contact prevention members 106 of the previous light emitting array element 102-1, as illustrated in FIG. 1(a), and then is moved in the direction of arrow A1 in FIG. 1(a) toward the previous light emitting array element 102-1 to the predetermined position, as illustrated in FIG. 1(b). At this time, the contact prevention members 106 of the adjacent light emitting array elements 102-1 and 102-2 may abut each other, or may face each other with a clearance of, for example, approximately from 1 µm to 3 µm formed therebetween.

As described above, the semiconductor device in this embodiment includes the contact prevention members 106 formed to project from the mutually facing end surfaces 102a of the adjacent light emitting array elements 102. This makes it possible to maintain the clearance D3 between the adjacent light emitting array elements 102 at a predetermined distance or more, thereby preventing contact between the mutually facing end surfaces 102a of the adjacent light emitting array elements 102. Further, since the contact prevention members 106 are formed of organic material, which is more flexible than semiconductor materials such as Si or GaAs, if they contact and impact each other, they are less likely to be damaged.

Further, the adhesive 108, which is used in die bonding of the light emitting array elements 102 to the printed wiring board 107, needs to be baked for curing at a temperature above 100° C., and thermal deformation of the printed wiring board 107 may change the arrangement of the light emitting array elements 102 in a random manner. In this embodiment, while the adhesive is being cured, the contact prevention members 106 keep the clearance between the adjacent light emitting array elements 102 constant. Thus, it is possible to prevent displacement of the light emitting array elements 102 due to baking for curing, thereby ensuring pitch continuity between the light emitting array elements 102.

Further, if the clearance between the adjacent light emitting array elements 102 is extremely small, the adhesive 108 ascends to the surfaces of the light emitting array elements 102 due to the capillary phenomenon and contaminates the light emitting elements 105. In this embodiment, since the clearance between the adjacent light emitting array elements 102 can be maintained at a predetermined distance or more, the contamination can be prevented.

A semiconductor device according to a comparative example will now be described with reference to FIG. 15.

As in the embodiment, the semiconductor device according to the comparative example includes plural light emitting array elements 602 (602-1 and 602-2) bonded onto a printed wiring board 607 with an adhesive 608. Each light emitting array element 602 includes a substrate 603 and plural light emitting elements 605 arranged in an arrangement direction (or longitudinal direction). The light emitting array elements 602 are arranged so that their end surfaces face each other in the arrangement direction.

In this comparative example, the light emitting array elements 602-1 and 602-2 have projections 603a-1 and 603a-2 on end surfaces of their substrates 603, respectively. These projections 603a-1 and 603a-2 abut each other, thereby maintaining a clearance between adjacent front surface portions of the light emitting array elements 602-1 and 602-2 during die bonding.

However, in this comparative example, since the substrates 603 made of semiconductor material, which is very hard and fragile, abut each other directly, it is highly likely that the ends of the light emitting array elements 602 are damaged when the printed wiring board 607 is bent during assembly of the semiconductor device or when the printed wiring board 607 contracts due to variation of an ambient temperature. On the other hand, according to the present embodiment, it is possible to maintain the clearance between adjacent light emitting array elements at the predetermined distance or more, thereby preventing the light emitting array elements from being damaged due to contact because of external factors.

A semiconductor device 151 according to a modification of this embodiment will now be described with reference to FIGS. 5(a) and 5(b).

Figures 5A, 5B:
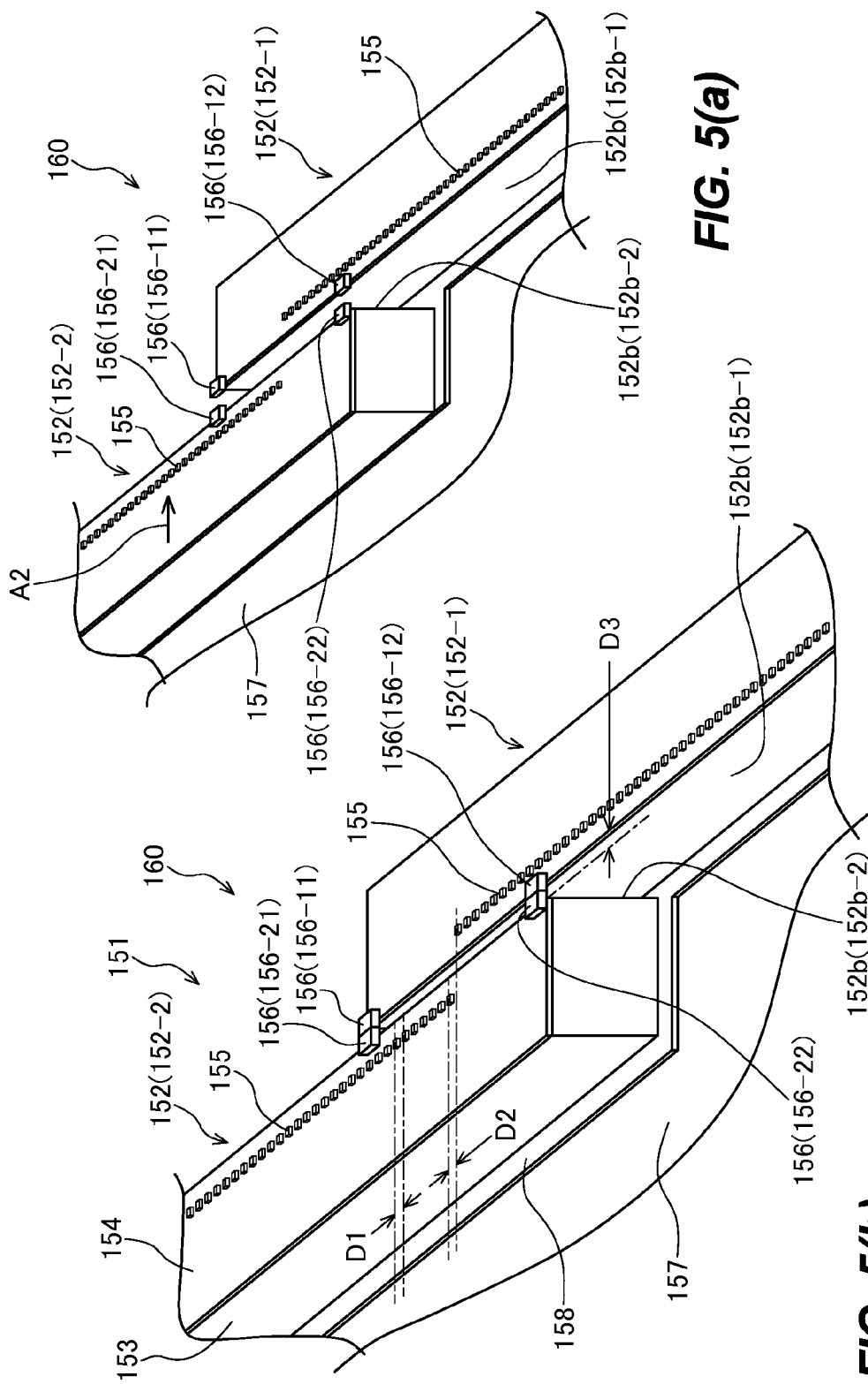
FIGS. 5(a) and 5(b) are external perspective views illustrating a periphery of adjacent ends of adjacent semiconductor array elements of a semiconductor device according to a modification of the first embodiment.

As illustrated in FIG. 5(b), the semiconductor device 151 includes a printed wiring board 157, plural light emitting array elements 152 (152-1 and 152-2) as a plurality of semiconductor array elements bonded onto the printed wiring board 157 with an adhesive 158, and a contact prevention structure 160 having a set of contact prevention members 156 (156-11, 156-12, 156-21, and 156-22). Each light emitting array elements 152 includes plural light emitting elements 155 as a plurality of semiconductor elements arranged in a row (or in a straight line) in an arrangement direction (or a longitudinal direction) on a surface of the light emitting array element 152. The light emitting array elements 152 are die-bonded onto the printed wiring board 157 so that the rows of the light emitting elements 155 of the light emitting array elements 152 are arranged in a staggered manner. FIG. 5(a) illustrates a state before the adjacent semiconductor array elements are positioned at predetermined positions; FIG. 5(b) illustrates a state after they are positioned at the predetermined positions.

Each of the light emitting array elements 152 includes a substrate 153, a wiring layer 154 formed on the substrate 153, and the plural light emitting elements 155, which are arranged on the wiring layer 154 in a straight line at a predetermined pitch (referred to below as the array pitch) D1.

The contact prevention structure 160 includes a first pair of contact prevention members 156 (156-11 and 156-12) as a first contact prevention member, and a second pair of contact prevention members 156 (156-21 and 156-22) as a second contact prevention member.

The light emitting array elements 152 face each other in a direction (referred to below as the lateral direction or sub scanning direction) perpendicular to the arrangement direction. Each of the light emitting array elements 152 has a side surface 152b that is located at one end in the lateral direction of the light emitting array element 152 and faces the other light emitting array element 152. Specifically, the light emitting array element 152-1 has a side surface 152b-1 as a first facing surface. The light emitting array element 152-2 has a side surface 152b-2 as a second facing surface. The side surfaces 152b-1 and 152b-2 face each other.

The contact prevention members 156-11 and 156-12 are disposed on the wiring layer 154 of the light emitting array element 152-1 so as to project from the side surface 152b-1 (or project toward the side surface 152b-2 relative to the side surface 152b-1) by a predetermined amount (or length). The contact prevention members 156-21 and 156-22 are disposed on the wiring layer 154 of the light emitting array element 152-2 so as to project from the side surface 152b-2 (or project toward the side surface 152b-1 relative to the side surface 152b-2) by a predetermined amount (or length).

Specifically, the contact prevention member 156-11 is disposed at one end in the longitudinal direction of an upper edge of the side surface 152b-1; the contact prevention member 156-12 is disposed at a position separated from the one end by a predetermined distance in the longitudinal direction. The contact prevention member 156-22 is disposed at one end in the longitudinal direction of an upper edge of the side surface 152b-2; the contact prevention member 156-21 is disposed at a position separated from the one end by a predetermined distance in the longitudinal direction.

In this modification, the light emitting elements 155 of the light emitting array element 152-1 are arranged on the side surface 152b-1 side so that a distance from the side surface 152b-1 to the light emitting elements 155 is a desired distance. The light emitting elements 155 of the light emitting array element 152-2 are arranged on the side surface 152b-2 side so that a distance from the side surface 152b-2 to the light emitting elements 155 is a desired distance.

As illustrated in FIG. 5(b), the light emitting array elements 152 are arranged in a staggered manner so that their side surfaces 152b face each other.

When the light emitting array elements 152 are sequentially die-bonded, it is desirable that after the light emitting array element 152-1 is die-bonded, the next light emitting array element 152-2 is die-bonded as follows. The next light emitting array element 152-2 is placed at a position where the contact prevention members 156 of the next light emitting array element 152-2 face and are spaced by a distance of, for example, approximately 100 μm from the contact prevention members 156 of the previous light emitting array element 152-1, as illustrated in FIG. 5(a), and then is moved in the direction of arrow A2 in FIG. 5(a) toward the previous light emitting array element 152-1 to the predetermined position, as illustrated in FIG. 5(b).

As illustrated in FIG. 5(b), the endmost light emitting element 155 adjacent to the light emitting array element 152-2 in the light emitting array element 152-1 and the endmost light emitting element 155 adjacent to the light emitting array element 152-1 in the light emitting array element 152-2 are arranged at a predetermined pitch (referred to below as the adjacent pitch) D2 in the main scanning direction (or the longitudinal direction). The adjacent light emitting array elements 152-1 and 152-2 are bonded onto the printed wiring board 157 so that the adjacent pitch D2 is equal to the array pitch D1. In this position, the two pairs of contact prevention members 156 face each other. At this time, the contact prevention members 156 of the adjacent light emitting array elements 152-1 and 152-2 may abut each other, or may face each other with a clearance of, for example, approximately from 1 μm to 3 μm formed therebetween.

When the light emitting array elements 152 are arranged in a staggered manner, the clearance D3 between the facing (or adjacent) light emitting array elements 152 is desirably as small as possible, and is required to be 50 μm or less, for example. This is because, for example, when the light emitting array elements 152 are used in an optical print head 453 described later (see FIG. 11), as the clearance D3 becomes larger, a difference between imaging positions becomes larger. Even when the clearance D3 is small, the contact prevention structure 160 makes it possible to die-bond the adjacent light emitting array elements 152 without contact between their side surfaces 152b, thereby preventing the side surfaces 152b from being damaged.

In the above description, the two adjacent light emitting array elements 152-1 and 152-2 are described, but the semiconductor device 151 may include three or more light emitting array elements 152 arranged in a row (or in a staggered manner). In this case, a contact prevention structure similar to the contact prevention structure 160 may be provided between each adjacent pair of the light emitting array elements 152. In one aspect, each light emitting array element 152 is provided with a pair of contact prevention members 156 at one end in the main scanning direction on one side in the sub scanning direction and another pair of contact prevention members 156 at the other end in the main scanning direction on the one side in the sub scanning direction.

The semiconductor device 151 according to this modification differs in form and arrangement from the semiconductor device 101 in the first embodiment. However, the materials of the respective parts and the manufacturing method of the semiconductor device 151 are the same as those of the semiconductor device 101, so descriptions thereof will be omitted here.

As described above, the semiconductor device according to this modification includes the contact prevention members 156 formed to project from the mutually facing side surfaces 152b of the adjacent light emitting array elements 152. This makes it possible to maintain the clearance D3 between the adjacent light emitting array elements 152 at a predetermined distance or more, thereby preventing contact between the mutually facing side surfaces 152b of the adjacent light emitting array elements 152. Further, since the contact prevention members 156 are formed of organic material, which is more flexible than semiconductor materials such as Si or GaAs, if they contact and impact each other, they are less likely to be damaged.

Further, the adhesive 158, which is used in die bonding of the light emitting array elements 152 to the printed wiring board 157, needs to be baked for curing at a temperature above 100° C., and thermal deformation of the printed wiring board 157 may change the arrangement of the light emitting array elements 152 in a random manner. In this embodiment, while the adhesive is being cured, the contact prevention members 156 keep the clearance between the adjacent light emitting array elements 152 constant. Thus, it is possible to prevent displacement of the light emitting array elements 152 due to baking for curing, thereby ensuring pitch continuity between the light emitting array elements 152.

Further, if the clearance between the adjacent light emitting array elements 152 is extremely small, the adhesive 158 ascends to the surfaces of the light emitting array elements 152 due to the capillary phenomenon and contaminates the light emitting elements 155. In this embodiment, since the clearance between the adjacent light emitting array elements 152 can be maintained at a predetermined distance or more, the contamination can be prevented.

Although the above description illustrates the light emitting elements 105 (or 155) as functional elements (or semiconductor elements) and the light emitting array elements 102 (or 152) as semiconductor array elements, light receiving elements may be formed instead of the light emitting elements 105 (or 155) and light receiving array elements may be used instead of the light emitting array elements 102 (or 152). In this case, an Si substrate is used as the substrate 103 (or 153); the materials of the respective parts and the manufacturing method are the same as or similar to those of the semiconductor device 101 (or 151), so descriptions thereof will be omitted here.

Second Embodiment

FIGS. 6(a) and 6(b) are partial external perspective views illustrating a periphery of adjacent ends of adjacent light emitting array elements 102 (102-1 and 102-2) of a semiconductor device 201 in the second embodiment of the present invention. FIG. 6(a) illustrates a state before the adjacent light emitting array elements 102 are positioned at predetermined positions; FIG. 6(b) illustrates a state after they are positioned at the predetermined positions. Each light emitting array element 102 includes plural light emitting elements 105 arranged in a straight line.

The semiconductor device 201 differs from the semiconductor device 101 in the first embodiment mainly in that it includes contact prevention members 206 to 209 different in shape from the contact prevention members 106. Parts of the semiconductor device 201 that are the same as those of the semiconductor device 101 are given the same reference characters or omitted from the drawings, descriptions thereof will be omitted or simplified, and differences will be mainly described.

As illustrated in FIG. 6(a), the light emitting array elements 102-1 and 102-2 are arranged so that their end surfaces 102a (102a-1 and 102a-2) face each other in the main scanning direction. The semiconductor device 201 includes a first pair of contact prevention members 206 and 207 as a first contact prevention member, and a second pair of contact prevention members 208 and 209 as a second contact prevention member. The first pair and the second pair face each other in a first direction (or the main scanning direction) in which the end surfaces 102a-1 and 102a-2 face each other and a second direction (or the sub scanning direction) different from the first direction. For example, the second direction is perpendicular to the first direction. The first pair of contact prevention members 206 and 207 is formed at both ends of an upper edge of the end surface 102a-1 on the light emitting array element 102-1 so as to project from the end surface 102a-1 by a predetermined projecting length. The second pair of contact prevention members 208 and 209 is formed at both ends of an upper edge of the end surface 102a-2 on the light emitting array element 102-2 so as to project from the end surface 102a-2 by a predetermined projecting length. The light emitting array elements 102-1 and 102-2 and contact prevention members 206 to 209 can be manufactured using the same materials and manufacturing method as in the first embodiment.

The first pair of contact prevention members 206 and 207 and the second pair of contact prevention members 208 and 209 are formed so that the second pair is fitted in (or engaged with) the first pair. This can restrict relative movement between the light emitting array element 102-1 and the light emitting array element 102-2 in the second direction (or the sub scanning direction). The second pair may be fitted in the first pair in contact with the first pair or fitted in the first pair adjacent to the first pair without contact.

Specifically, the contact prevention members 206 and 207 have abutting portions 206a and 207a, and restricting portions 206b and 207b, respectively. The abutting portions 206a and 207a project from the end surface 102a-1 by a predetermined projecting length. The restricting portion 206b extends from an end on a side opposite the contact prevention member 207 in the sub scanning direction of the abutting portion 206a toward the light emitting array element 102-2, which is adjacent to the contact prevention member 206 in the main scanning direction. The restricting portion 207b extends from an end on a side opposite the contact prevention member 206 in the sub scanning direction of the abutting portion 207a toward the light emitting array element 102-2, which is adjacent to the contact prevention member 207 in the main scanning direction.

When the light emitting array elements 102 are sequentially die-bonded onto the printed wiring board 107, it is desirable that after the light emitting array element 102-1 is die-bonded, the next light emitting array element 102-2 is die-bonded as follows. The next light emitting array element 102-2 is placed at a position where the contact prevention members 208 and 209 of the next light emitting array element 102-2 face and are spaced by a distance of, for example, approximately 100 μm from the contact prevention members 206 and 207 of the previous light emitting array element 102-1, as illustrated in FIG. 6(*a*), and then is moved in the direction of arrow A3 in FIG. 6(*a*) toward the previous light emitting array element 102-1 to the predetermined position, as illustrated in FIG. 6(*b*).

In the sub scanning direction, a distance between the restricting portions 206*b* and 207*b* is set so that the contact prevention members 208 and 209 can be fitted into a space between the restricting portions 206*b* and 207*b* with a slight tolerance (or margin). Thus, the contact prevention members 206 to 209 also effectively function as guides when the light emitting array elements 102 are die-bonded.

When the adjacent light emitting array elements 102 are die-bonded to the predetermined positions, the abutting portions 206*a* and 207*a* of the contact prevention members 206 and 207 and the contact prevention members 208 and 209 may abut each other, or may face each other with a clearance of, for example, approximately from 1 μm to 3 μm, in the main scanning direction.

In the sub scanning direction, each of the contact prevention members 206 to 209 has a tolerance of, for example, 5 μm or less, and the distance between the restricting portions 206*b* and 207*b* is set to allow these tolerances.

In FIG. 6(*b*), the first pair faces both sides of the second pair in the sub scanning direction. However, the first pair may face only one side of the second pair in the sub scanning direction. For example, one of the restricting portions 206*b* and 207*b* may be removed from the corresponding contact prevention member.

Semiconductor devices according to first and second modifications of this embodiment will be described below with reference to FIGS. 7(*a*) and 7(*b*).

Figure 7A:
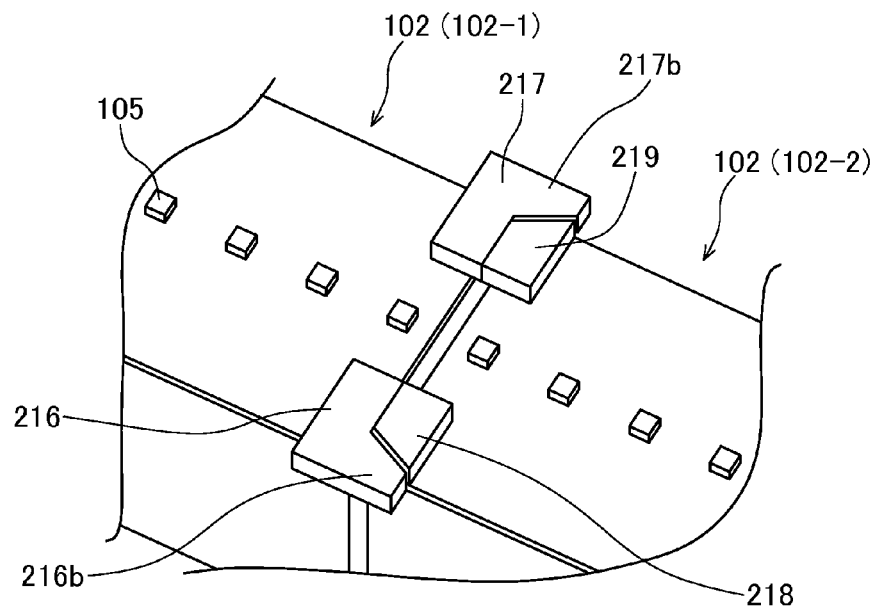
FIG. 7(a) is an external perspective view illustrating a periphery of adjacent ends of adjacent light emitting array elements of a semiconductor device according to a first modification of the second embodiment.
Figure 7B:
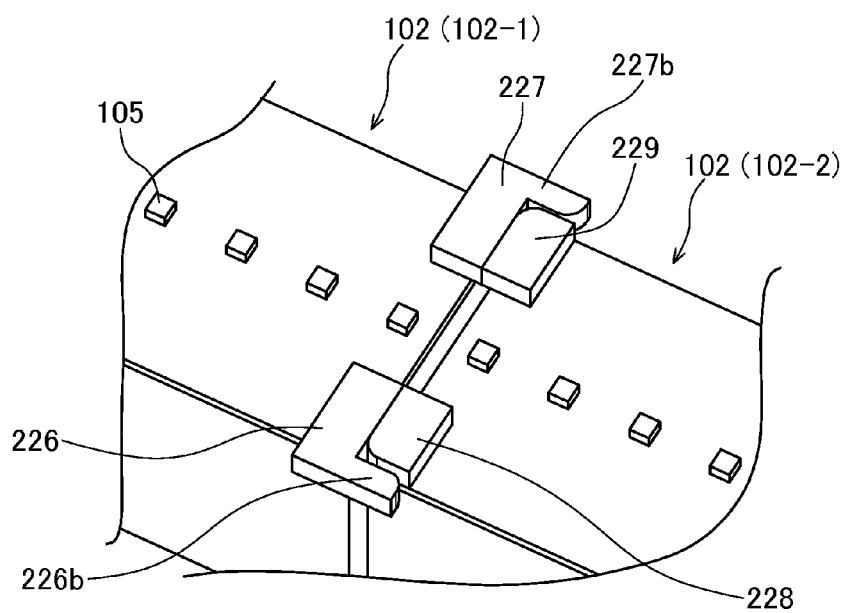
FIG. 7(b) is an external perspective view illustrating a periphery of adjacent ends of adjacent light emitting array elements of a semiconductor device according to a second modification of the second embodiment.

FIG. 7(*a*) is a partial external perspective view illustrating a periphery of adjacent ends of adjacent light emitting array elements 102 (102-1 and 102-2) of the semiconductor device according to the first modification. As illustrated in FIG. 7(*a*), the semiconductor device includes a first pair of contact prevention members 216 and 217 as a first contact prevention member, and a second pair of contact prevention members 218 and 219 as a second contact prevention member.

At least one of the first and second pairs has a tapered shape. For example, the first pair forms a space in which the second pair is fitted. The first pair has a tapered shape so that in the sub scanning direction, the width of the space increases (or the space becomes wider) toward the light emitting array element 102-2. The second pair has a tapered shape so that the width of the second pair in the sub scanning direction decreases toward the light emitting array element 102-1.

The contact prevention members 216 and 217 respectively have restricting portions 216*b* and 217*b*. The restricting portions 216*b* and 217*b* have inside portions as a first fitting portion, and the contact prevention members 218 and 219 have outside portions as a second fitting portion facing the inside portions. The inside portions have tapered shapes. The outside portions have tapered shapes. This facilitates insertion of the contact prevention members 218 and 219 into the contact prevention members 216 and 217. The contact prevention members 216 and 217 form a fitting space into which the contact prevention members 218 and 219 are inserted in the main scanning direction. The width of the fitting space in the sub scanning direction increases toward the light emitting array element 102-2. The contact prevention members 218 and 219 have side surfaces facing the contact prevention members 216 and 217 in the sub scanning direction. The distance between the side surfaces in the sub scanning direction reduces toward the light emitting array element 102-1.

FIG. 7(*b*) is a partial external perspective view illustrating a periphery of adjacent ends of adjacent light emitting array elements 102 (102-1 and 102-2) of the semiconductor device according to the second modification. As illustrated in FIG. 7(*b*), the semiconductor device includes a first pair of contact prevention members 226 and 227 as a first contact prevention member, and a second pair of contact prevention members 228 and 229 as a second contact prevention member.

At least one of the first and second pairs has an R-shape (or a round shape). For example, the first pair forms a space in which the second pair is fitted. The first pair has an R-shape so that in the sub scanning direction, the width of the space increases (or the space becomes wider) toward the light emitting array element 102-2. The second pair has an R-shape so that the width of the second pair in the sub scanning direction decreases toward the light emitting array element 102-1.

The contact prevention members 226 and 227 respectively have restricting portions 226*b* and 227*b*. The restricting portions 226*b* and 227*b* have inside portions as a first fitting portion, and the contact prevention members 228 and 229 have outside portions as a second fitting portion facing the inside portions. The inside portions have R-shapes (or round shapes), which are specifically formed at the ends on the light emitting array element 102-2 side in the main scanning direction of the restricting portions 226*b* and 227*b*. The outside portions have R-shapes (or round shapes), which are specifically formed at the ends on the light emitting array element 102-1 side in the main scanning direction of the contact prevention members 228 and 229. This facilitates insertion of the contact prevention members 228 and 229 into the contact prevention members 226 and 227. The contact prevention members 226 and 227 form a fitting space into which the contact prevention members 228 and 229 are inserted in the main scanning direction. The width of the fitting space in the sub scanning direction increases toward the light emitting array element 102-2. The contact prevention members 228 and 229 have side surfaces facing the contact prevention members 226 and 227 in the sub scanning direction. The distance between the side surfaces in the sub scanning direction reduces toward the light emitting array element 102-1.

As described above, the semiconductor device in this embodiment includes the contact prevention members 206 to 209 (or 216 to 219 or 226 to 229) formed to project from the mutually facing end surfaces 102*a* of the adjacent light emitting array elements 102. This makes it possible to maintain the clearance between the adjacent light emitting array elements 102 at a predetermined distance or more. Thus, the contact prevention members function as spacers for preventing contact between the mutually facing end surfaces 102*a* of the adjacent light emitting array elements 102 during die bonding. Further, since the contact prevention members 206 to 209 are formed of organic material, which is more flexible than semiconductor materials such as Si or GaAs, if they contact and impact each other, they are less likely to be damaged.

Further, the adhesive 108, which is used in die bonding of the light emitting array elements 102 to the printed wiring board 107, needs to be baked for curing at a temperature above 100° C., and thermal deformation of the printed wiring board 107 may change the arrangement of the light emitting array elements 102 in a random manner. In this embodiment, while the adhesive is being cured, the contact prevention members 206 to 209 (or 216 to 219 or 226 to 229) keep the clearance between the adjacent light emitting array elements 102 constant. Thus, it is possible to prevent displacement of the light emitting array elements 102 due to baking for curing, thereby ensuring pitch continuity between the light emitting array elements 102.

Further, if the clearance between the adjacent light emitting array elements 102 is extremely small, the adhesive 108 ascends to the surfaces of the light emitting array elements 102 due to the capillary phenomenon and contaminates the light emitting elements 105. In this embodiment, since the clearance between the adjacent light emitting array elements 102 can be maintained at a predetermined distance or more, the contamination can be prevented.

Further, the contact prevention members 216 to 219 in the first modification have tapered shapes, and the contact prevention members 226 to 229 in the second modification have R-shapes. These configurations facilitate the insertion.

A semiconductor device 251 according to a third modification of this embodiment will be described below with reference to FIGS. 8(a) and 8(b).

The semiconductor device 251 differs from the semiconductor device 151 according to the modification of the first embodiment in FIG. 5(b) mainly in that it includes contact prevention members 256 to 259 different in shape from the contact prevention members 156. Parts of the semiconductor device 251 that are the same as those of the semiconductor device 151 are given the same reference characters or omitted from the drawings, descriptions thereof will be omitted or simplified, and differences will be mainly described.

The semiconductor device 251 includes light emitting array elements 152 (152-1 and 152-2) each including light emitting elements 155 arranged in a row (or in a straight line) on its surface. The light emitting array elements 152 are die-bonded onto a printed wiring board 157 so that the rows of the light emitting elements 155 of the light emitting array elements 152 are arranged in a staggered manner. FIG. 8(a) illustrates a state before the adjacent semiconductor array elements are positioned at predetermined positions; FIG. 8(b) illustrates a state after they are positioned at the predetermined positions.

As illustrated in FIG. 8(a), the light emitting array element 152-1 has a side surface 152b-1 at an end in the sub scanning direction; the light emitting array element 152-2 has a side surface 152b-2 at an end in the sub scanning direction. The light emitting array elements 152-1 and 152-2 are arranged so that the side surfaces 152b-1 and 152b-2 face each other. The contact prevention members 256 and 257 are formed on the light emitting array element 152-2 so as to project from the side surface 152b-2 by a predetermined projecting length. The contact prevention member 256 is disposed at one end of an upper edge of the side surface 152b-2; the contact prevention member 257 is disposed at a position separated from the one end by a predetermined distance on the upper edge. The contact prevention members 258 and 259 are formed on the light emitting array element 152-1 so as to project from the side surface 152b-1 by a predetermined projecting length. The contact prevention members 258 and 259 are disposed at positions facing the contact prevention members 256 and 257 on an upper edge of the side surface 152b-1, respectively. The light emitting array elements 152 and contact prevention members 256 to 259 can be manufactured using the same materials and manufacturing method as in the first embodiment.

The contact prevention members 256 and 257 have abutting portions 256a and 257a, and restricting portions 256b and 257b, respectively. The abutting portions 256a and 257a project from the side surface 152b-2 by a predetermined projecting length. The restricting portion 256b extends from an end near the contact prevention member 257 in the main scanning direction of the abutting portion 256a toward the light emitting array element 152-1, which is adjacent to the contact prevention member 256 in the sub scanning direction. The restricting portion 257b extends from an end near the contact prevention member 256 in the main scanning direction of the abutting portion 257a toward the light emitting array element 152-1, which is adjacent to the contact prevention member 257 in the sub scanning direction.

When the light emitting array elements 152 are sequentially die-bonded onto the printed wiring board 157, it is desirable that after the light emitting array element 152-1 is die-bonded, the next light emitting array element 152-2 is die-bonded as follows. The next light emitting array element 152-2 is placed at a position where the contact prevention members 256 and 257 of the next light emitting array element 152-2 face and are spaced by a distance of, for example, approximately 100 μm from the contact prevention members 258 and 259 of the previous light emitting array element 152-1, as illustrated in FIG. 8(a), and then is moved in the direction of arrow A4 in FIG. 8(a) toward the previous light emitting array element 152-1 to the predetermined position, as illustrated in FIG. 8(b).

In the main scanning direction, a distance between the contact prevention members 258 and 259 is set so that the restricting portions 256b and 257b of the contact prevention members 256 and 257 can be fitted into a space between the contact prevention members 258 and 259 with a slight tolerance (or margin). Thus, the contact prevention members 256 to 259 also effectively function as guides when the light emitting array elements 152 are die-bonded.

When the adjacent light emitting array elements 152 are die-bonded to the predetermined positions, the abutting portions 256a and 257a of the contact prevention members 256 and 257 and the contact prevention members 258 and 259 may abut each other, or may face each other with a clearance of, for example, approximately from 1 μm to 3 μm, in the sub scanning direction.

In the main scanning direction, each of the contact prevention members 256 to 259 has a tolerance of, for example, 5 μm or less, and the distance between the contact prevention members 258 and 259 is set to allow these tolerances.

As described above, the semiconductor device according to the third modification includes the contact prevention members 256 to 259 formed to project from the mutually facing side surfaces 152b of the adjacent light emitting array elements 152. This makes it possible to maintain the clearance between the adjacent light emitting array elements 152 at a predetermined distance or more. Thus, the contact prevention members 256 to 259 function as spacers for preventing contact between the mutually facing side surfaces 152b of the adjacent light emitting array elements 152 during die bonding. Further, since the contact prevention members 256 to 259 are formed of organic material, which is more flexible than semiconductor materials such as Si or GaAs, if they contact and impact each other, they are less likely to be damaged.

Further, the adhesive 158, which is used in die bonding of the light emitting array elements 152 to the printed wiring board 157, needs to be baked for curing at a temperature above 100° C., and thermal deformation of the printed wiring board 157 may change the arrangement of the light emitting array elements 152 in a random manner. In this modification, while the adhesive is being cured, the contact prevention members 256 to 259 keep the clearance between the adjacent light emitting array elements 152 constant. Thus, it is possible to prevent displacement of the light emitting array elements 152 due to baking for curing, thereby ensuring pitch continuity between the light emitting array elements 152.

Further, if the clearance between the adjacent light emitting array elements 152 is extremely small, the adhesive 158 ascends to the surfaces of the light emitting array elements 152 due to the capillary phenomenon and contaminates the light emitting elements 155. In this modification, since the clearance between the adjacent light emitting array elements 152 can be maintained at a predetermined distance or more, the contamination can be prevented.

Further, in a staggered arrangement as illustrated in FIG. 8(b), it is possible to maintain the clearance between the light emitting array elements 152 in the sub scanning direction at a predetermined distance or more. By engaging the contact prevention members 256 and 257 with the contact prevention members 258 and 259, it is possible to stabilize the positions of the adjacent light emitting array elements 152 in the main scanning direction.

Third Embodiment

FIGS. 9(a) and 9(b) are partial external perspective views illustrating a periphery of adjacent ends of adjacent light emitting array elements 102 (102-1 and 102-2) of a semiconductor device 301 in the third embodiment of the present invention. FIG. 9(a) illustrates a state before the adjacent light emitting array elements 102 are positioned at predetermined positions; FIG. 9(b) illustrates a state after they are positioned at the predetermined positions. Each light emitting array element 102 includes plural light emitting elements 105 arranged in a straight line.

The semiconductor device 301 differs from the semiconductor device 101 in the first embodiment in FIG. 1(b) mainly in that it includes contact prevention members 306 and 307 different in shape from the contact prevention members 106. Parts of the semiconductor device 301 that are the same as those of the semiconductor device 101 are given the same reference characters or omitted from the drawings, descriptions thereof will be omitted or simplified, and differences will be mainly described.

As illustrated in FIG. 9(a), the light emitting array elements 102 (102-1 and 102-2) are arranged so that their end surfaces 102a (102a-1 and 102a-2) face each other in the main scanning direction. The contact prevention members 306 and 307 are configured to cover the end surfaces 102a-1 and 102a-2 (or a clearance between the adjacent light emitting array elements 102-1 and 102-2) on a side opposite the printed wiring board 107. Specifically, the contact prevention member 306 is formed on the light emitting array element 102-1 so as to uniformly project from an upper edge of the end surface 102a-1 by a predetermined projecting length. The contact prevention member 307 is formed on the light emitting array element 102-2 so as to uniformly project from an upper edge of the end surface 102a-2 by a predetermined projecting length.

In one aspect, each light emitting array element 102 is provided with a contact prevention member 306 at one end surface 102a and a contact prevention member 307 at the other end surface 102a.

The light emitting array elements 102 and contact prevention members 306 and 307 can be manufactured using the same materials and manufacturing method as in the first embodiment.

Further, each of the contact prevention members 306 and 307 has, opposite the projecting side, a recessed portion for avoiding contact with the light emitting elements 105 and interruption of light emitted by the light emitting elements 105.

When the light emitting array elements 102 are sequentially die-bonded onto the printed wiring board 107, it is desirable that after the light emitting array element 102-1 is die-bonded, the next light emitting array element 102-2 is die-bonded as follows. The next light emitting array element 102-2 is placed at a position where the contact prevention member 307 of the next light emitting array element 102-2 faces and is spaced by a distance of, for example, approximately 100 μm from the contact prevention member 306 of the previous light emitting array element 102-1, as illustrated in FIG. 9(a), and then is moved in the direction of arrow A5 in FIG. 9(a) toward the previous light emitting array element 102-1 to the predetermined position, as illustrated in FIG. 9(b).

When the adjacent light emitting array elements 102 are die-bonded to the predetermined positions, the contact prevention members 306 and 307 may abut each other, or may face each other with a clearance of, for example, approximately from 1 μm to 3 μm therebetween, in the main scanning direction.

As described above, the semiconductor device in this embodiment includes the contact prevention members 306 and 307 formed to project from the mutually facing end surfaces 102a of the adjacent light emitting array elements 102. This makes it possible to maintain the clearance between the adjacent light emitting array elements 102 at a predetermined distance or more. Thus, the contact prevention members 306 and 307 function as spacers for preventing contact between the mutually facing end surfaces 102a of the adjacent light emitting array elements 102 during die bonding. Further, since the contact prevention members 306 and 307 are formed of organic material, which is more flexible than semiconductor materials such as Si or GaAs, if they contact and impact each other, they are less likely to be damaged.

Further, the adhesive 108, which is used in die bonding of the light emitting array elements 102 to the printed wiring board 107, needs to be baked for curing at a temperature above 100° C., and thermal deformation of the printed wiring board 107 may change the arrangement of the light emitting array elements 102 in a random manner. In this embodiment, while the adhesive is being cured, the contact prevention members 306 and 307 keep the clearance between the adjacent light emitting array elements 102 constant. Thus, it is possible to prevent displacement of the light emitting array elements 102 due to baking for curing, thereby ensuring pitch continuity between the light emitting array elements 102.

Further, if the clearance between the adjacent light emitting array elements 102 is extremely small, the adhesive 108 ascends to the surfaces of the light emitting array elements 102 due to the capillary phenomenon and contaminates the light emitting elements 105. In this embodiment, since the clearance between the adjacent light emitting array elements 102 can be maintained at a predetermined distance or more, the contamination can be prevented.

Further, the contact prevention members 306 and 307 in this embodiment are disposed to cover an upper part of the clearance (or gap) between the adjacent light emitting array elements 102. This makes it possible to more effectively restrict ascension (or an ascending portion 108a) of the adhesive 108 in the clearance due to the capillary phenomenon.

A semiconductor device 351 according to a modification of this embodiment will be described below with reference to FIGS. 10(a) and 10(b).

The semiconductor device 351 differs from the semiconductor device 151 according to the modification of the first embodiment in FIG. 5(b) mainly in that it includes contact prevention members 356 and 357 different in shape from the contact prevention members 156. Parts of the semiconductor device 351 that are the same as those of the semiconductor device 151 are given the same reference characters or omitted from the drawings, descriptions thereof will be omitted or simplified, and differences will be mainly described.

The semiconductor device 351 includes light emitting array elements 152 (152-1 and 152-2) each including light emitting elements 155 arranged in a row (or in a straight line) on its surface. The light emitting array elements 152 are die-bonded onto a printed wiring board 157 so that the rows of the light emitting elements 155 of the light emitting array elements 152 are arranged in a staggered manner. FIG. 10(a) illustrates a state before the adjacent semiconductor array elements are positioned at predetermined positions; FIG. 10(b) illustrates a state after they are positioned at the predetermined positions.

In FIG. 10(a), the light emitting array elements 152-1 and 152-2 have side surfaces 152b (152b-1 and 152b-2) in the sub scanning direction, respectively. The light emitting array elements 152-1 and 152-2 are arranged so that the side surfaces 152b-1 and 152b-2 face each other. The contact prevention member 356 is formed on the light emitting array element 152-2 so as to extend in the main scanning direction by a predetermined distance from one end of an upper edge of the side surface 152b-2 and uniformly project from the side surface 152b-2 by a predetermined projecting length. The contact prevention member 357 is formed on the light emitting array element 152-1 so as to extend facing the contact prevention member 356 on an upper edge of the side surface 152b-1 and uniformly project from the side surface 152b-1 by a predetermined projecting length.

In one aspect, each light emitting array element 152 is provided with a contact prevention member 356 at one end in the main scanning direction on one side in the sub scanning direction and a contact prevention member 357 at the other end in the main scanning direction on the one side in the sub scanning direction in such a manner that each of the contact prevention members 356 and 357 uniformly projects by a predetermined distance from the side surface 152b on the one side.

The light emitting array elements 102 and contact prevention members 356 and 357 can be manufactured using the same materials and manufacturing method as in the first embodiment.

When the light emitting array elements 152 are sequentially die-bonded onto the printed wiring board 157, it is desirable that after the light emitting array element 152-1 is die-bonded, the next light emitting array element 152-2 is die-bonded as follows. The next light emitting array element 152-2 is placed at a position where the contact prevention member 356 of the next light emitting array element 152-2 faces and is spaced by a distance of, for example, approximately 100 μm from the contact prevention member 357 of the previous light emitting array element 152-1, as illustrated in FIG. 10(a), and then is moved in the direction of arrow A6 in FIG. 10(a) toward the previous light emitting array element 152-1 to the predetermined position, as illustrated in FIG. 10(b).

When the adjacent light emitting array elements 152 are die-bonded to the predetermined positions, the contact prevention members 356 and 357 may abut each other, or may face each other with a clearance of, for example, approximately from 1 μm to 3 μm therebetween, in the sub scanning direction.

As described above, the semiconductor device according to this modification includes the contact prevention members 356 and 357 formed to project from the mutually facing side surfaces 152b of the adjacent light emitting array elements 152. This makes it possible to maintain the clearance between the adjacent light emitting array elements 152 at a predetermined distance or more. Thus, the contact prevention members 356 and 357 function as spacers for preventing contact between the mutually facing side surfaces 152b of the adjacent light emitting array elements 152 during die bonding. Further, since the contact prevention members 356 and 357 are formed of organic material, which is more flexible than semiconductor materials such as Si or GaAs, if they contact and impact each other, they are less likely to be damaged.

Further, the adhesive 158, which is used in die bonding of the light emitting array elements 152 to the printed wiring board 157, needs to be baked for curing at a temperature above 100° C., and thermal deformation of the printed wiring board 157 may change the arrangement of the light emitting array elements 152 in a random manner. In this modification, while the adhesive is being cured, the contact prevention members 356 and 357 keep the clearance between the adjacent light emitting array elements 152 constant. Thus, it is possible to prevent displacement of the light emitting array elements 152 due to baking for curing, thereby ensuring pitch continuity between the light emitting array elements 152.

Further, if the clearance between the adjacent light emitting array elements 152 is extremely small, the adhesive 158 ascends to the surfaces of the light emitting array elements 152 due to the capillary phenomenon and contaminates the light emitting elements 155. In this modification, since the clearance between the adjacent light emitting array elements 152 can be maintained at a predetermined distance or more, the contamination can be prevented.

Further, in a staggered arrangement as illustrated in FIG. 10(b), the contact prevention members 356 and 357 can maintain the clearance between the light emitting array elements 152 in the sub scanning direction at a predetermined distance or more.

Further, the contact prevention members 356 and 357 are disposed to cover the upper part of the clearance (or gap) between the adjacent light emitting array elements 152. This makes it possible to more effectively restrict ascension (or an ascending portion 158a) of the adhesive 158 in the clearance due to the capillary phenomenon.

Fourth Embodiment

Figure 11B:
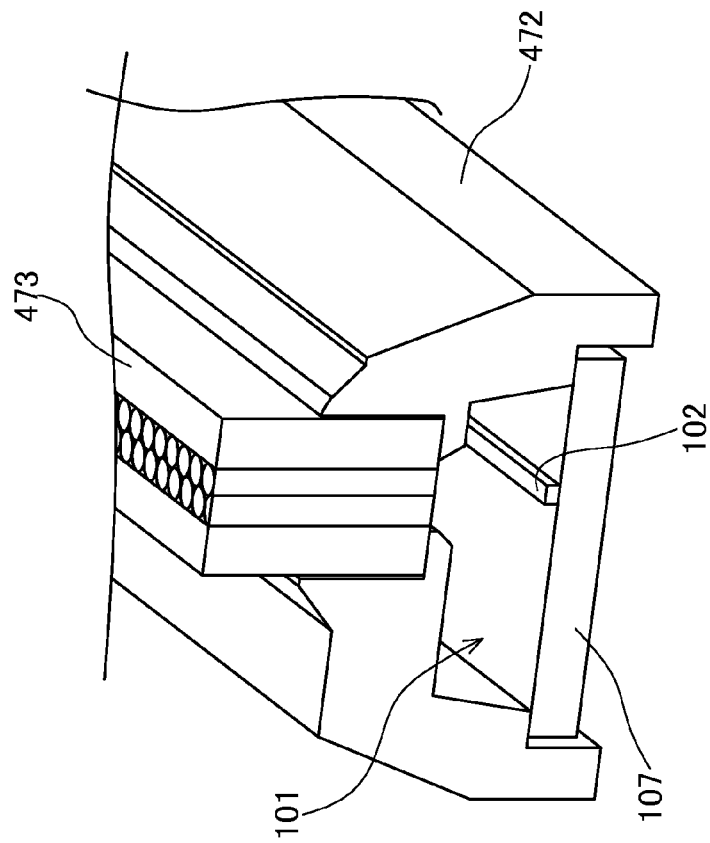
FIG. 11(b) is an enlarged perspective view illustrating a cross section taken along line A-A in FIG. 11(a)
Figure 11A:
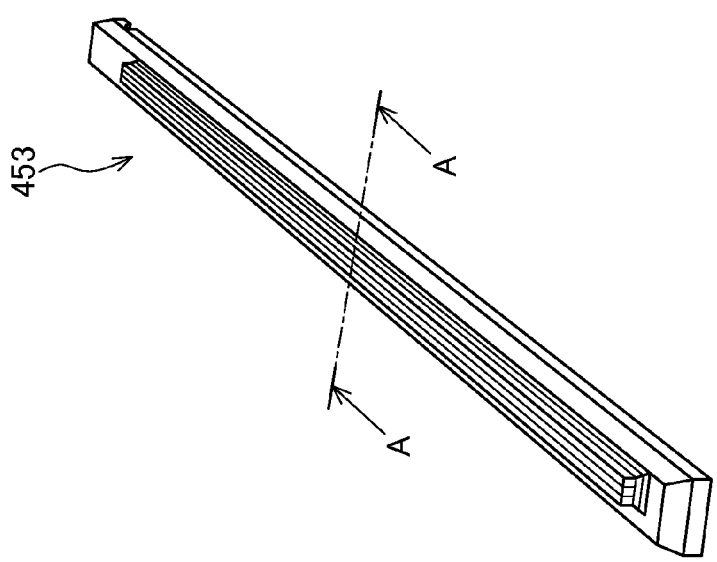
FIG. 11(a) is an external perspective view of an optical print head in a fourth embodiment of the present invention.

FIG. 11(a) is an external perspective view of an optical print head 453 in the fourth embodiment of the present invention. FIG. 11(b) is an enlarged perspective view illustrating a cross section taken along line A-A in FIG. 11(a).

In FIG. 11(b), the optical head 453 includes the semiconductor device 101 described in the first embodiment, a rod lens array 473, and a frame 472. The optical head 453 has a resolution of, for example, 600 dpi or 1200 dpi.

As described above, the semiconductor device 101 includes the plural light emitting array elements 102 arranged on the printed wiring board 107 so that a predetermined number of light emitting elements 105 (see FIG. 1(b)) are arranged in a line at the array pitch D1. The rod lens array 473 focuses light emitted by the respective light emitting elements 105 to a focal point. The semiconductor device 101 and rod lens array 473 are positioned and fixed to the frame 472 using an UV adhesive or the like so that their positional relationship is fixed. That is, the frame 472 holds the semiconductor device 101 and rod lens array 473 in a predetermined positional relationship. The frame 472 is made of, for example, aluminum, structural steel, or liquid crystal polymer.

In the above description, the semiconductor device 101 described in the first embodiment is used as the semiconductor device constituting the optical print head 453, but the other semiconductor devices 151, 201, 251, 301, and 351 described in the first to third embodiments may be used.

Figure 12:
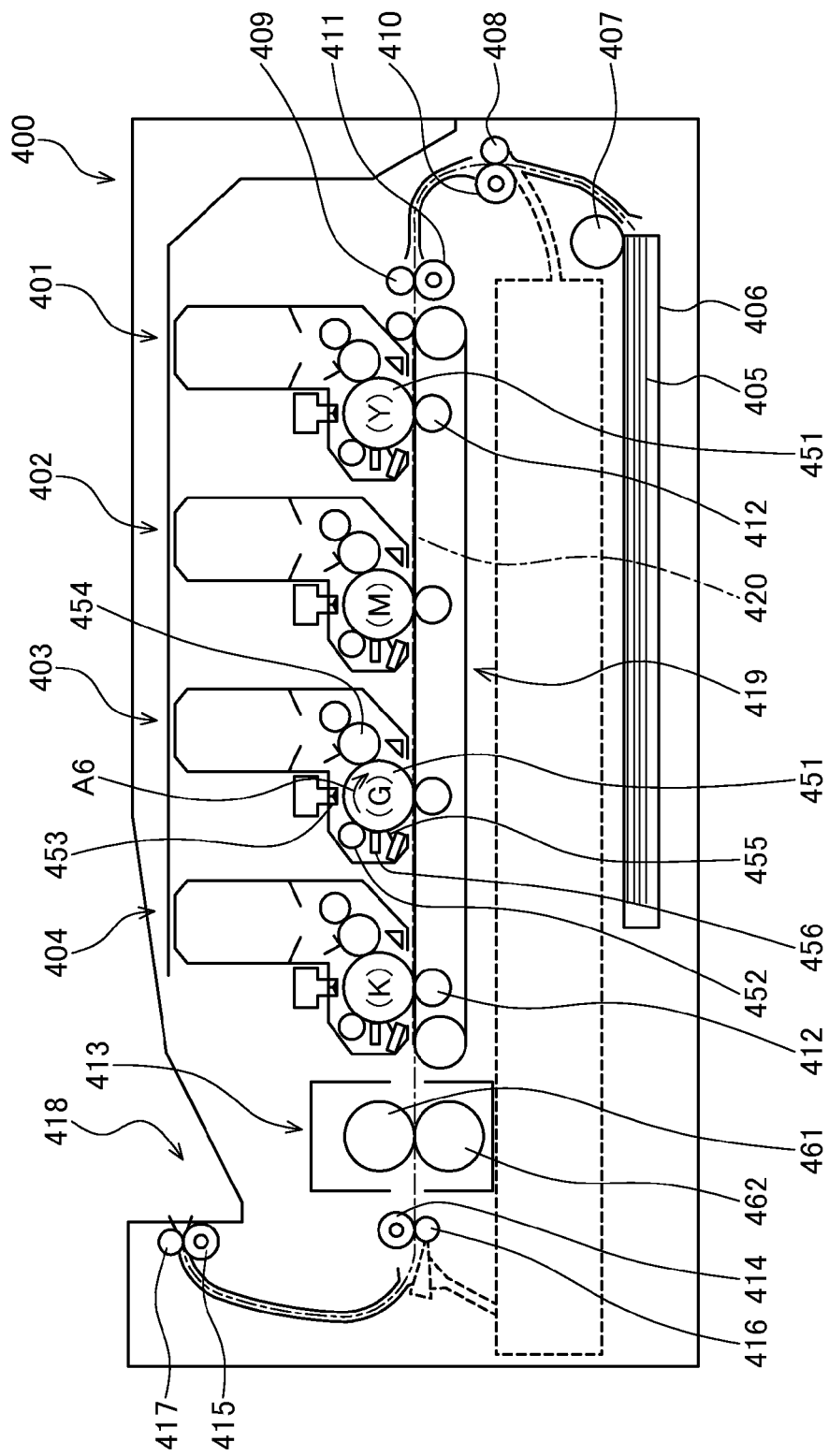
FIG. 12 illustrates the configuration of a color printer using the optical print head.

FIG. 12 illustrates the configuration of a color printer 400 as an image forming apparatus using the optical print head 453. The configuration of the color printer 400 will be described below.

In FIG. 12, the color printer 400 includes process units 401, 402, 403, and 404 that form toner images of yellow (Y), magenta (M), cyan (C), and black (K), respectively. The process units 401, 402, 403, and 404 are detachably arranged in this order from an upstream side of a conveying path 420 of a recording medium 405. The process units 401 to 404 have the same internal configuration, so only the internal configuration of the cyan (C) process unit 403 will be described.

The process unit 403 includes a photosensitive drum 451 rotatable in the direction of arrow A6 in FIG. 12. The process unit 403 further includes a charging roller 452, the optical print head 453, a developing roller 454, a cleaning blade 455, and a neutralizing device 456, which are arranged around the photosensitive drum 451 in this order in the direction of rotation of the photosensitive drum 451. The charging roller 452 supplies charge to a surface of the photosensitive drum 451 to charge the surface. The optical print head 453 includes the semiconductor device 101, and selectively illuminates the charged surface of the photosensitive drum 451 with light emitted by the light emitting elements 105 (see FIG. 1(*b*)) in accordance with image data to form an electrostatic latent image on the surface. The developing roller 454 applies cyan (C) toner to the surface of the photosensitive drum 451 on which the electrostatic latent image is formed, thereby forming a toner image. The cleaning blade 455 removes residual toner remaining on the photosensitive drum 451 after the toner image formed on the photosensitive drum 451 is transferred onto a recording medium 405. The neutralizing device 456 eliminates unevenness of potential on the surface of the photosensitive drum 451. The above drum and rollers are rotated by power transmitted from a driving source (not illustrated) via gears or the like.

The color printer 400 further includes a sheet cassette 406, a hopping roller 407, pinch rollers 408 and 409, a conveying roller 410, a registration roller 411, transfer rollers 412, a fixing unit 413, discharge rollers 414 and 415, pinch rollers 416 and 417, a recording medium stacker 418, and a belt conveying device 419.

The sheet cassette 406 is disposed at a lower part of the color printer 400 and stores recording media 405 such as sheets of paper in a stacked manner. The hopping roller 407 is disposed above a medium discharging side of the sheet cassette 406, and separates and conveys the recording media 405 one by one. The conveying roller 410 and registration roller 411 are disposed downstream of the hopping roller 407 in a conveying direction of the recording medium 405. The conveying roller 410 conveys the recording medium 405 by pinching it together with the pinch roller 408. The registration roller 411 corrects a skew of the recording medium 405 and conveys the recording medium 405 to the process unit 401 by pinching it together with the pinch roller 409. The hopping roller 407, conveying roller 410, and registration roller 411 are rotated by power transmitted from a driving source (not illustrated) via gears or the like.

The transfer rollers 412 are disposed at positions facing the respective photosensitive drums 451 of the process units 401 to 404, and made of conductive rubber or the like. The transfer rollers 412 sequentially transfer and superpose the toner images formed on the photosensitive drums 451 onto the recording medium 405. At this time, each transfer roller 412 is applied with a voltage to provide a potential difference between the surface of the transfer roller 412 and the surface of the corresponding photosensitive drum 451.

The fixing unit 413 includes a heating roller 461 and a pressure roller 462, and fixes the transferred toner image to the recording medium 405 by applying heat and pressure. The discharge rollers 414 and 415 are disposed downstream of the fixing unit 413, and pinch and convey the recording medium 405 discharged from the fixing unit 413 together with the corresponding pinch rollers 416 and 417 to discharge it to the recording medium stacker 418. The heating roller 461 and pressure roller 462 in the fixing unit 413, discharge rollers 414 and 415, and the like are rotated by power transmitted from a driving source (not illustrated) via gears or the like.

The belt conveying device 419 forms a conveying path on which the recording medium 405 is conveyed past the respective process units 401 to 404, and conveys the recording medium 405 from the registration roller 411 to the fixing unit 413.

In the above configuration, the recording media 405 stored in the sheet cassette 406 are separated and conveyed on the conveying path 420 one by one by the hopping roller 407. The conveyed recording medium 405 is subjected to correction of skew feeding by the registration roller 411 and conveyed to the belt conveying device 419. As the recording medium 405 passes through the respective process units 401 to 404, toner images of the respective colors formed on the respective photosensitive drums 451 are sequentially transferred onto the recording medium 405 in a superposed manner by the transfer rollers 412. Then, the recording medium 405 reaches the fixing unit 413. As the recording medium 405 passes through the fixing unit 413, it is heated and pressed by the heating roller 461 and pressure roller 462, so that the transferred toner image is fixed onto the recording medium 405. Then, the recording medium 405 is discharged onto the recording medium stacker 418 by the discharge rollers 414 and 415.

As described above, the optical print head 453 in this embodiment uses one of the semiconductor devices 101, 151, 201, 251, 301, and 351 described in the first to third embodiments, that is, a semiconductor device including a contact prevention structure between adjacent light emitting array elements 102 (or 152). Thus, when the semiconductor device is fixed to the frame 472, even if it is subjected to stress due to external force, the light emitting array elements can be prevented from being damaged due to contact or the like. This can improve the yields of the optical print heads 453 and color printers using them.

Fifth Embodiment

FIG. 13(*a*) is an external perspective view of a contact image sensor head 502 in the fifth embodiment of the present invention. FIG. 13(*b*) is an enlarged perspective view illustrating a cross section taken along line B-B in FIG. 13(*a*).

In FIG. 13(*b*), the contact image sensor head 502 includes a semiconductor device 111, a rod lens array 551, a light source 552, a frame 553, and a transparent body 554. The contact image sensor head 502 has a resolution of, for example, 600 dpi or 1200 dpi.

The semiconductor device 111 is the same as the semiconductor device 101 (or 151) described in the first embodiment except that it has light receiving elements instead of the light emitting elements 105 (or 155) and light receiving array elements 112 instead of the light emitting array elements 102 (or 152).

The semiconductor device 111 includes plural light receiving array elements 112 arranged in a straight line (or in a staggered manner) on the printed wiring board 107 so that a predetermined number of light receiving elements are arranged in a line at the array pitch D1. The rod lens array 551 receives light that is emitted by the light source 552 and reflected from an object, and focuses the light on the light receiving elements at its focal point. The semiconductor device 111, rod lens array 551, and light source 552 are positioned and fixed to the frame 553 using an UV adhesive or the like so that the positional relationship between the semiconductor device 111 and the rod lens array 551 is fixed and the light source 552 is positioned. That is, the frame 553 holds the semiconductor device 111 and rod lens array 551 in a predetermined positional relationship. The transparent body 554 covers the interior of the frame 553 and is made of, for example, soda lime glass. The frame 553 is made of, for example, aluminum, structural steel, or liquid crystal polymer.

In the above description, the contact image sensor head 502 uses the semiconductor device 111, which is the same as the semiconductor device 101 (or 151) described in the first embodiment except that it has the light receiving elements instead of the light emitting elements, but it may use a semiconductor device that is the same as one of the other semiconductor devices 201, 251, 301, and 351 described in the second and third embodiments except that it has light receiving elements instead of the light emitting elements.

Figure 14:
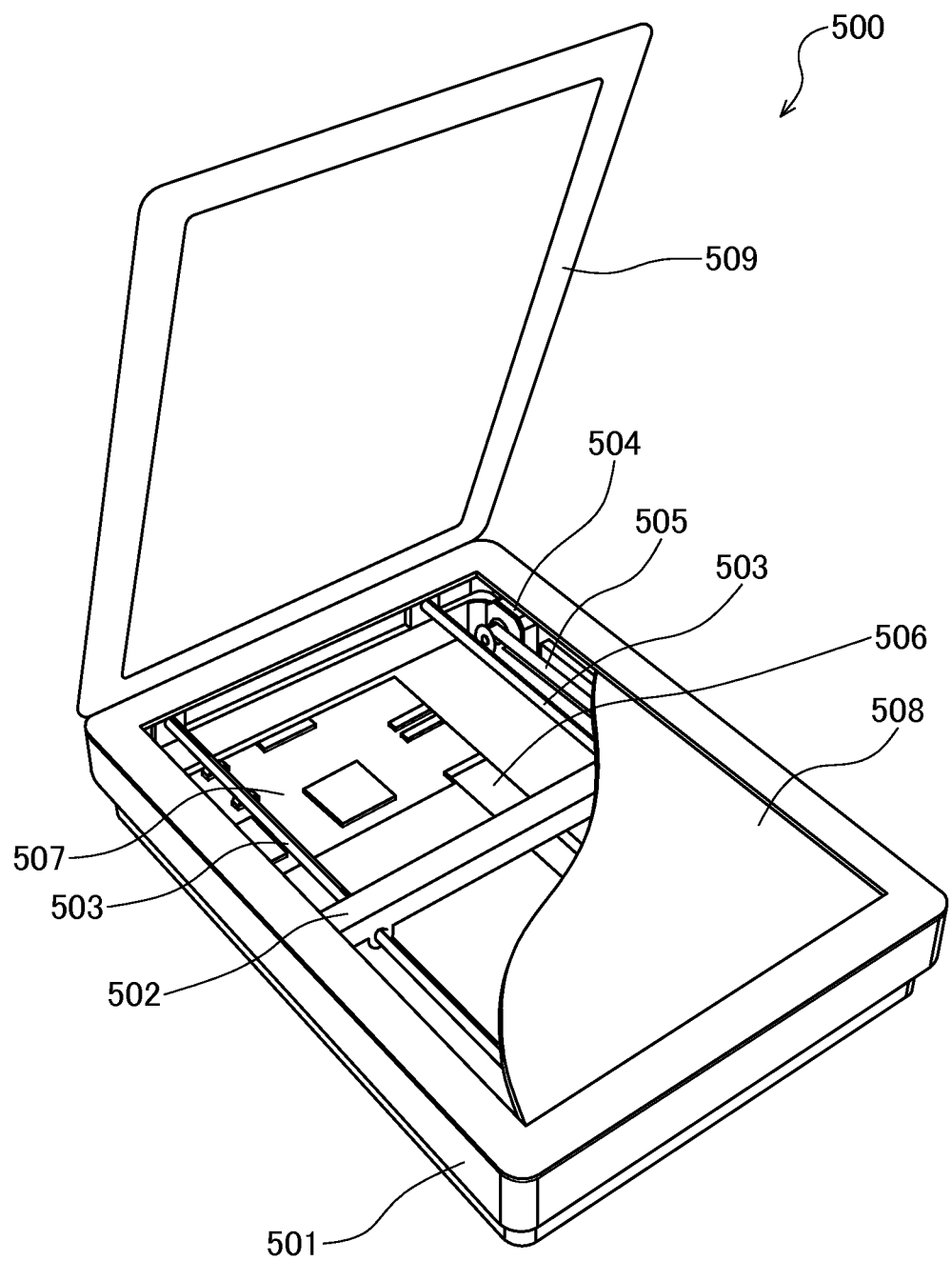
FIG. 14 illustrates the configuration of an image scanner using the contact image sensor head.

FIG. 14 is an external perspective view of an image scanner 500 as an image reading apparatus using the contact image sensor head 502. The configuration of the image scanner 500 will be described below.

The image scanner 500 in FIG. 14 is a flatbed image scanner, and includes a housing 501, the contact image sensor head 502, a pair of guides 503, a stepping motor 504, a drive belt 505, a flexible flat cable 506, a control circuit 507, a platen 508, and a cover 509. A part of the platen 508 is cut away in FIG. 14 to illustrate the internal configuration.

As illustrated in FIG. 14, the platen 508 is disposed to form an upper surface of the housing 501. The platen 508 has a placing surface on which an original (or an object to be read) is to be placed. The platen 508 and cover 509 are configured to sandwich an original placed on the placing surface of the platen 508 therebetween. The guides 503 are disposed parallel to each other in the housing 501, and support the contact image sensor head 502 slidably in the sub scanning direction along the placing surface of the platen 508.

To slide the contact image sensor head 502 along the guides 503 in the sub scanning direction, the contact image sensor head 502 is connected to the drive belt 505, which is moved by the stepping motor 504. The control circuit 507 is electrically connected to the contact image sensor head 502 via the flexible flat cable 506 to control the contact image sensor head 502.

In the above configuration, the image scanner 500 sequentially reads an original placed on the placing surface (or an upper surface) of the platen 508 by the light receiving elements arranged in the main scanning direction while moving the contact image sensor head 502 in the sub scanning direction.

As described above, the image scanner 500 in this embodiment uses a semiconductor device that is the same as one of the semiconductor devices described in the first to third embodiments except that it has light receiving array elements with light receiving elements instead of the light emitting array elements with the light emitting elements. Thus, when the semiconductor device is fixed to the frame 553, even if it is subjected to stress due to external force, the light receiving array elements can be prevented from being damaged due to contact or the like. This can improve the yields of the contact image sensor heads 502 and image scanners 500 using them.

In the descriptions of the above embodiments, the terms 'upper', 'above', 'lower', and the like are used for convenience of explanation, and not intended to limit an absolute positional relationship in a state where a semiconductor device or an apparatus using the semiconductor device is set.

While the preferred embodiments of the present invention have been illustrated in detail, it should be apparent that modifications and improvements may be made to the invention without departing from the spirit and scope of the invention as described in the following claims.

For example, although the fourth and fifth embodiments illustrate the color printer and image scanner, the application of the present invention is not limited to these examples. The present invention is applicable to other image devices using light emitting elements or light receiving elements, such as a copier, a facsimile machine, and a multi-function peripheral (MFP). Further, although the fourth embodiment illustrates the color printer, the present invention is also applicable to a monochrome printer.

What is claimed is:

1. A semiconductor device comprising:
a printed wiring board;
a plurality of semiconductor array elements mounted on the printed wiring board in a row with an adhesive, each of the plurality of semiconductor array elements including a plurality of semiconductor elements arranged in a row, the plurality of semiconductor array elements including a first semiconductor array element and a second semiconductor array element adjacent to the first semiconductor array element, the first semiconductor array element having a first facing surface, the second semiconductor array element having a second facing surface facing the first facing surface;
a first contact prevention member that is made of organic material and disposed to project from the first facing surface; and
a second contact prevention member that is made of organic material and disposed to project from the second facing surface,
wherein the first contact prevention member and the second contact prevention member are disposed to abut each other or face each other with a gap between the first contact prevention member and the second contact prevention member.

2. The semiconductor device of claim 1, wherein the plurality of semiconductor array elements are arranged in a straight line.

3. The semiconductor device of claim 1, wherein the plurality of semiconductor array elements are arranged in a staggered manner.

4. The semiconductor device of claim 1, wherein the first contact prevention member and the second contact prevention member are formed so that the second contact prevention member is fitted in the first contact prevention member, and wherein the first contact prevention member and the second contact prevention member face each other in a first direction in which the first facing surface and the second facing surface face each other and a second direction different from the first direction.

5. The semiconductor device of claim 4, wherein at least one of the first contact prevention member and the second contact prevention member has an R-shape.

6. The semiconductor device of claim 4, wherein at least one of the first contact prevention member and the second contact prevention member has a tapered shape.

7. The semiconductor device of claim 1, wherein the first contact prevention member and the second contact prevention member cover the first facing surface and the second facing surface on a side opposite the printed wiring board.

8. The semiconductor device of claim 1, wherein the first contact prevention member and the second contact prevention member are formed of epoxy resin.

9. The semiconductor device of claim 1, wherein the first contact prevention member and the second contact prevention member are formed of acrylic resin.

10. The semiconductor device of claim 1, wherein the first contact prevention member and the second contact prevention member are formed of imide resin.

11. The semiconductor device of claim 1, wherein the first contact prevention member and the second contact prevention member are formed of silicone resin.

12. The semiconductor device of claim 1, wherein the first contact prevention member and the second contact prevention member are formed of dry film resist.

13. The semiconductor device of claim 1, wherein the plurality of semiconductor elements are light emitting elements.

14. The semiconductor device of claim 1, wherein the plurality of semiconductor elements are light receiving elements.

15. An image forming apparatus comprising an optical print head including:
    the semiconductor device of claim 13;
    a rod lens array that focuses light emitted by the light emitting elements; and
    a frame that holds the semiconductor device and the rod lens array in a predetermined positional relationship.

16. An image reading apparatus comprising a contact image sensor head including:
    the semiconductor device of claim 14;
    a rod lens array that focuses light on the light receiving elements; and
    a frame that holds the semiconductor device and the rod lens array in a predetermined positional relationship.

* * * * *